United States Patent
Ueda et al.

(10) Patent No.: US 7,737,614 B2
(45) Date of Patent: Jun. 15, 2010

(54) DIAMOND ELECTRON EMISSION CATHODE, ELECTRON EMISSION SOURCE, ELECTRON MICROSCOPE, AND ELECTRON BEAM EXPOSURE DEVICE

(75) Inventors: Akihiko Ueda, Itami (JP); Yoshiyuki Yamamoto, Itami (JP); Yoshiki Nishibayashi, Itami (JP); Takahiro Imai, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 454 days.

(21) Appl. No.: 11/665,459
(22) PCT Filed: Jun. 19, 2006
(86) PCT No.: PCT/JP2006/012262
§ 371 (c)(1), (2), (4) Date: Apr. 16, 2007
(87) PCT Pub. No.: WO2006/135093
PCT Pub. Date: Dec. 21, 2006

(65) Prior Publication Data
US 2008/0048544 A1 Feb. 28, 2008

(30) Foreign Application Priority Data
Jun. 17, 2005 (JP) ............................. 2005-178163
Sep. 6, 2005 (JP) ............................. 2005-257452
Sep. 6, 2005 (JP) ............................. 2005-257791

(51) Int. Cl.
H01J 1/02 (2006.01)
H01J 19/06 (2006.01)
(52) U.S. Cl. .................. 313/310; 313/309; 313/311
(58) Field of Classification Search ........ 313/309–311
See application file for complete search history.

(56) References Cited

U.S. PATENT DOCUMENTS 5,289,086 A 2/1994 Kane (Continued)

FOREIGN PATENT DOCUMENTS

JP 62-140332 6/1987

(Continued)

OTHER PUBLICATIONS

Namba, et al., "Synthesis of Phosphorus-doped Diamond Semiconductor and Application to Electron Emitters", SEI Technical Review, Mar. 2005, pp. 38-44, vol. 166, Sumitomo Electric Industries, Ltd.

(Continued)

*Primary Examiner*—Nimeshkumar D Patel
*Assistant Examiner*—Anne M Hines
(74) *Attorney, Agent, or Firm*—McDermott Will & Emery LLP

(57) ABSTRACT

An object is to provide an electron emission cathode and an electron emission source using diamond and having a high brightness and a small energy width that are suitable for electron ray and electron beam devices and vacuum tubes, in particular, electron microscopes and electron beam exposure devices, and also electronic devices using such cathode and source. A diamond electron emission cathode according to the present invention has single crystal diamond in at least part thereof, the diamond electron emission cathode having a columnar shape formed by a sharpened acute section and a heating section, being provided with one electron emitting portion in the sharpened acute section, and being constituted of at least two types of semiconductors that differ in electric properties. One of the types constituting the semiconductors is an n-type semiconductor containing n-type impurities at $2 \times 10^{15}$ cm$^3$ or higher, the other one is a p-type semiconductor containing p-type impurities at $2 \times 10^{15}$ cm$^{-3}$ or higher, the p-type semiconductor and the n-type semiconductor are joined together, the heating section is energized parallel to the junction surface and directly heated by a pair of current introducing terminals, and some of the introduced electrons are emitted from the electron emitting portion.

30 Claims, 15 Drawing Sheets

U.S. PATENT DOCUMENTS

| | | | |
|---|---|---|---|
| 5,552,613 | A | 9/1996 | Nishibayashi et al. |
| 5,844,252 | A | 12/1998 | Shiomi et al. |
| 6,184,611 | B1 | 2/2001 | Saito et al. |
| 6,267,637 | B1 | 7/2001 | Saito et al. |
| 2004/0056580 | A1 | 3/2004 | Nishibayashi et al. |
| 2004/0095051 | A1 | 5/2004 | Nishibayashi et al. |

FOREIGN PATENT DOCUMENTS

| | | |
|---|---|---|
| JP | 4-67527 | 3/1992 |
| JP | 6-36680 | 2/1994 |
| JP | 7-94077 | 4/1995 |
| JP | 9-199001 | 7/1997 |
| JP | 10-312735 | 11/1998 |
| JP | 2004-119018 | 4/2004 |
| JP | 2004-119019 | 4/2004 |
| JP | 2005-108634 | 4/2005 |
| JP | 2005-108637 | 4/2005 |

OTHER PUBLICATIONS

Himpsel, et al., "Quantum photoyield of diamond(111)-A stable negative-affinity emitter", Physical Review B, Jul. 15, 1979, pp. 624-627, vol. 20, No. 2, The American Physical Society.

Ristein, et al., "The Role of Adsorbates and Defects on Diamond Surfaces", New Diamond and Frontier Carbon Technology, 2000, pp. 363-382, vol. 10, No. 6, MYU Tokyo.

Nishibayashi, et al., "Development of "Diamond Nano-Emitters"", SEI Technical Review, Jan. 2004, pp. 31-36, No. 57.

Choi, et al., "Field emission from diamond coated molybdenum field emitters", J. Vac. Sci. Technol. B, May/Jun. 1996, pp. 2050-2055, vol. 14, No. 3, American Vacuum Society.

International Preliminary Report on Patentability and Written Opinion of the International Search Authority, issued in corresponding International Patent Application No. PCT/JP2006/312262, mailed Jan. 3, 2008.

FIG. 10
(a)
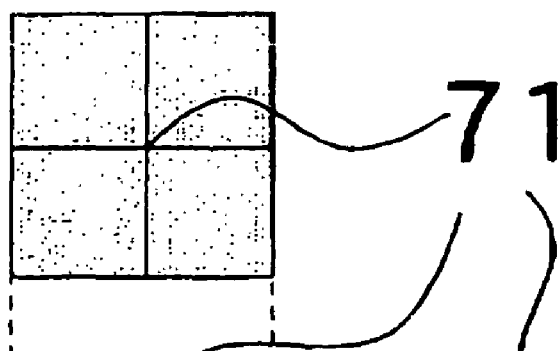
(b) 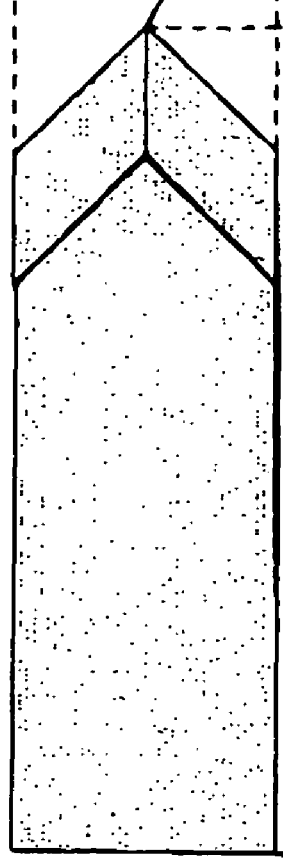 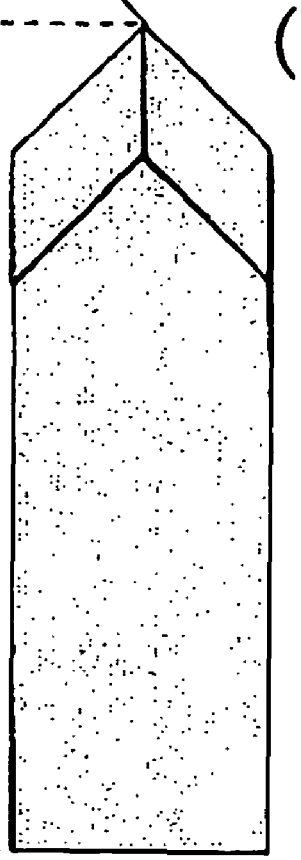 (c)
71

DIAMOND ELECTRON EMISSION CATHODE, ELECTRON EMISSION SOURCE, ELECTRON MICROSCOPE, AND ELECTRON BEAM EXPOSURE DEVICE

RELATED APPLICATIONS

This application is the U.S. National Phase under 35 U.S.C. §371 of International Application No. PCT/JP2006/31262 filed Jun. 19, 2006, which claims the benefit of Japanese Application Nos. 2005-178163 filed Jun. 17, 2005, 2005-257452 filed Sep. 6, 2005, and 2005-257791 filed Sep. 6, 2005, the disclosures of which Applications are incorporated by reference herein.

TECHNICAL FIELD

The present invention relates to a diamond electron emission cathode and an electron emission source for use in electron ray and electron beam devices such as electron microscopes and electron beam exposure devices and also in vacuum tubes such as traveling wave tubes and microwave tubes and also to electronic devices using such cathode and source.

BACKGROUND ART

Because an electron bears a negative charge and has a very small mass, electron beams in which electrons are arranged to travel in one direction have the following special features. (1) The direction and the degree of convergence can be controlled by an electric or magnetic field. (2) Energy in a wide range can be obtained by acceleration and deceleration with an electric field. (3) Because the wavelength is short, the beam can be converged to a small diameter. Electron microscopes and electron beam exposure devices employing such special features have been widely used. As cathode materials for such devices, cheap W filaments or hexaborides, e.g., $LaB_6$ which can produce an electron beam with a high brightness, are exemplified for thermal electron emission sources. Further, W with a sharpened tip that uses a tunnel phenomenon based on a quantum effect and ZrO/W using the Schottky effect based on electric filed application have been used as cathodes with a high brightness and a narrow energy width.

However, although W filaments are inexpensive, a problem associated therewith is that the service life thereof is extremely short (about 100 hours). The resultant problem is that a replacement operation such as opening a vacuum container to the atmosphere or adjusting the optical axis of electron beam when the filament is broken has to be frequently performed. The service life of $LaB_6$ is about 1000 hours and longer than that of W filaments, but because it is used in devices in which beams with a comparatively high brightness are obtained, the replacement operation is most often performed by the device manufacturers and the cost thereof is high. A problem associated with ZrO/W that has a comparatively long service life (about one year) and W with a sharpened tip that allows a higher brightness to be obtained is that the replacement cost is high.

Because electron microscopes are presently required to enable highly accurate observations of even smaller objects and because the development of electron beam exposure devices advanced to a node size of less than 65 nm, the cathodes with even higher brightness and narrower energy width are needed.

Diamond is a material that meets such expectations. Diamond exists in a state with a negative electron affinity (NEA) or in a state with a positive electron affinity (PEA) less than that of metals with a small work function, as described in Non-Patent Document 1 and Non-Patent Document 2. By employing such an extremely rare physical property, it is possible to obtain electron emission with a high current density and to reduce the energy width, without requiring a high temperature in excess of 1000° C. as in W filaments, $LaB_6$, or ZrO/W. Further, because the operation temperature is low, a long service life can be expected. In addition, because there is a microprocessing technology that can produce a tip end diameter of 10 nm, as described in Non-Patent Document 3, no problems are associated with increase in brightness. Since diamond has been found to have the aforementioned electron affinity, electron sources as described in Non-Patent Document 4 and Patent Document 1 have been proposed.

Non-Patent Document 1: F. J. Himpsel et al., Phys. Rev. B., Vol. 20, Number 2 (1979), 624-

Non-Patent Document 2: J. Ristein et al., New Diamond and Frontier Carbon Technology, Vol. 10, No. 6, (2000) 363-

Non-Patent Document 3: Y. Nishibayashi et al., SEI Technical Review, 57, (2004) 31-

Non-Patent Document 4: W. B. Choi et al., J. Vac. Sci. Technol. B14 (1996) 2051-

Patent Document 1: Japanese Patent Publication No. 4-67527A

DISCLOSURE OF THE INVENTION

Problems that the Invention is to Solve

However, the following problems are encountered when electron sources using diamond are employed in electronic microscopes or electron beam exposure devices that have become widely spread. Thus, structures in which a plurality of electron emission points, such as described in Non-Patent Document 3, are arranged side by side become plane electron sources and a small-diameter beam is difficult to obtain by converging. Mounting on the device is also a difficult task. No problems are associated with the shape when Mo with a sharpened tip is coated with diamond, as described in Non-Patent Document 4, but because of a polycrystalline structure there are differences between individual species and variations in electric characteristics. Because the structure suggested in Patent Document 1 is also a plane electron source, a converged beam is difficult to obtain. Such source is also difficult to mount on the device.

Accordingly, with the foregoing in view, it is an object of the present invention to provide an electron emission cathode and an electron emission source using diamond and having a high brightness and a small energy width that are suitable for electron ray and electron beam devices and vacuum tubes, in particular, electron microscopes and electron beam exposure devices, and to an electron microscope and an electron beam exposure device that use such electron emission cathode and electron emission source.

Means for Solving the Problems

In order to resolve the above-described problems, the diamond electron emission cathode in accordance with the present invention employs the following construction.

A diamond electron emission cathode in accordance with the present invention is a diamond electron emission cathode having single crystal diamond in at least part thereof, this diamond electron emission cathode having a columnar shape formed by a sharpened acute section and a heating section, being provided with one electron emitting portion in the sharpened acute section, and being constituted of at least two types of semiconductors that differ in electric properties, one of the types constituting the semiconductor being an n-type semiconductor comprising n-type impurities at $2\times10^{15}$ cm$^{-3}$ or higher, the other one being a p-type semiconductor comprising p-type impurities at $2\times10^{15}$ cm$^{-3}$ or higher, the p-type semiconductor and the n-type semiconductor being joined together, the heating section being energized parallel to the junction surface and directly heated by a pair of current introducing terminals, and some of the introduced electrons being emitted from the electron emitting portion.

Energizing the heating section parallel to the junction surface and directly heating the heating section by a pair of current introducing terminals means that heating is performed at the same electric potential, without application of bias voltage.

Such diamond electron emission cathode contains almost no dissimilar materials. Therefore, cathode fracture during heating and cooling caused by the difference in thermal expansion coefficients is prevented. The term "almost" used herein indicates the case where the cathode shape of the diamond electron emission cathode does not depend on any material other than diamond. Accordingly, this excludes the case where the cathode shape mainly depends on a material other than diamond, as in the shape in which diamond is coated on Mo having a sharpened tip end, as described in Non-Patent Document 4. Further, because at least part of the diamond electron emission cathode is composed of single crystal diamond, the doping concentration of n-type impurities that are necessary to use diamond as a cathode material can be controlled in the process of vapor-phase growing the diamond, this control being difficult with the polycrystalline materials. Further, the removal of moisture or the like that has adhered to the surface of the sharpened acute section, such operation being necessary for stabilizing the emission current, can be performed in an easy manner by heating via the heating section. In addition, because of a columnar shape having a sharpened acute section with one electron emitting portion, an electron emission cathode with a high brightness can be fabricated.

The diamond electron emission cathode in accordance with the present invention is composed of semiconductors of two or more types with different electric properties, wherein an n-type semiconductor containing n-type impurities at $2\times10^{15}$ cm$^{-3}$ or higher is used as a first semiconductor and a p-type semiconductor containing p-type impurities at $2\times10^{15}$ cm$^{-3}$ or higher is used as a second semiconductor. "Different electric properties" as referred to herein means that semiconductors differ in a semiconductor conduction type, specific resistance, effective work function, electron affinity, or the like due to a difference in the type or concentration of impurities in the diamond. By appropriately combining such properties, an electron emission cathode with high efficiency can be realized. The "effective work function" as referred to herein indicates an activation energy found from the dependence of the electron emission current on temperature. In order to perform efficient electron transport from the current introducing terminal to the electron emitting portion when the electron emitting portion is composed of the first semiconductor, it is preferred that an n-type semiconductor containing n-type impurities at $2\times10^{15}$ cm$^{-3}$ or higher and having a low specific resistance be selected as the first semiconductor. When a semiconductor contains n-type impurities at such a concentration, electrons located in the conduction band of the diamond are released into vacuum. Therefore, the work function is effectively small and electron emission at a high current density can be performed. Alternatively, when the electron emitting portion is composed of a second semiconductor, in order to perform highly efficient electron transport from the first semiconductor to the second semiconductor, it is preferred that an n-type semiconductor containing n-type impurities at $2\times10^{15}$ cm$^{-3}$ or higher and having a low specific resistance be selected. Further, it is preferred that a semiconductor with a low specific resistance that enables the efficient heating of the first semiconductor or a semiconductor with a small or negative electron affinity be selected as the second semiconductor. With diamond, a comparatively shallow acceptor level of p-type impurities and a low resistance are easily obtained and a small or negative electron affinity is easily obtained. Therefore, a p-type semiconductor containing p-type impurities at $2\times10^{15}$ cm$^{-3}$ or higher is suitable therefor. Using a semiconductor with a low specific resistance decreases the specific resistance of the entire electron emission cathode. Therefore, when the cathode is used at the same temperature as that of the electron emission cathode with a comparatively high specific resistance, the current for resistance heating can be increased. Therefore, the number of electrons reaching the electron emitting portion is increased. As a result, the electron emission efficiency is advantageously increased. The first semiconductor and second semiconductor are joined together. By joining the semiconductors together, the exchange of heat or electrons can be effectively performed. As a result, the effect produced by the above-described combination can be demonstrated to even larger extent.

Further, the heating section is energized almost parallel to the junction surface and directly heated by a pair of current introducing terminals. Because direct heating with a pair of current introducing terminals is used, replaceability with the conventional electron sources such as W filaments, LaB$_6$, or ZrO/W can be attained, and the electron emission cathode in accordance with the present invention can be installed in electronic devices, e.g., in the already existing electron microscopes and electron beam exposure devices. Further, because a pair of current introducing terminals that are necessary for electron emission are brought into contact with both the first semiconductor and the second semiconductor and the heating section is energized almost parallel to the junction surface, the two semiconductors are almost at the same electric potential, without the application of a bias voltage. Because the semiconductors are at the same electric potential, annihilation of electrons by electron-hole coupling caused by an electric field between a pair of current introducing terminals in the zone between the two semiconductors is prevented. Therefore, when the electron emitting portion is composed of the first semiconductor, a highly efficient electron emission can be realized. On the other hand, because the portion to be heated is heated by a pair of electron introducing terminals, electrons move from the first semiconductor to the second semiconductor by diffusion. Therefore, when the electron emitting portion is composed of the second semiconductor, the electrons that moved to the second semiconductor by diffusion in the vicinity of an acute electron emitting portion are released into vacuum by themselves. Therefore, electron emission at a high current density is possible.

In the diamond electron emission cathode in accordance with the present invention, the electron emitting portion may be an n-type semiconductor. When the electron emitting portion is composed of an n-type semiconductor, that is, the first semiconductor, the electrons supplied from a pair of current introducing electrodes are transported only by the first semiconductor in which electrons are the major carrier and released from the electron emitting portion into vacuum. In this case, the second semiconductor is used as a resistor for resistance heating (i.e., heating by current conduction), the activation rate of the donors in the first semiconductor by heat is increased, and the number of electrons in the conduction band is increased, whereby a highly efficient electron emission is realized.

Alternatively, in the diamond electron emission cathode in accordance with the present invention, the electron emitting portion may be a p-type semiconductor. When the electron emitting portion is composed of a p-type semiconductor, that is, the second semiconductor, the electrons supplied from a pair of current introducing terminals are transported by the first semiconductor, in which electrons are the major carrier, to the vicinity of the electron emitting portion and move to the second semiconductor by diffusion. The diffusion is initiated with good efficiency by heat produced by resistance heating. By selecting a p-type semiconductor with a small or negative electron affinity as the second semiconductor, a highly efficient electron emission is realized. In this case, the second semiconductor is used as a resistor for resistance heating and acts to increase the activation rate of donors of the first semiconductor by heating and increase the number of electrons in the conduction band.

Alternatively, in the diamond electron emission cathode in accordance with the present invention, the n-type semiconductor that is the first semiconductor and the p-type semiconductor that is the second semiconductor may be joined via an intrinsic semiconductor with a carrier concentration of $1 \times 10^9$ $cm^{-3}$ or less as a third semiconductor, and some of the electrons introduced from the current introducing terminals may be emitted from the electron emitting portion composed of the intrinsic semiconductor that is the third semiconductor. By comparison with the case where the second semiconductor, that is, p-type semiconductor, is selected for the electron emitting portion, the number of electrons annihilated by coupling with holes after diffusion is reduced practically to zero. Therefore, the effect produced by the above-described combination can be demonstrated to a maximum extent and electron emission with even higher efficiency can be realized.

In the diamond electron emission cathode in accordance with the present invention, the p-type semiconductor that is the second semiconductor is preferably formed from a single crystal synthesized by vapor phase growth, and the n-type semiconductor that is the first semiconductor and the intrinsic semiconductor that is the third semiconductor are formed from thin-film crystals synthesized by vapor phase growth. By comparison with the case where a p-type semiconductor diamond grown as a single crystal at a high temperature and under a high pressure is used, the vapor-phase grown crystal has a comparatively small number of impurities introduced in addition to p-type impurities and a high quality. As a result, the electrons are difficult to trap. Furthermore, because crystallinity of the n-type semiconductor that is the first semiconductor and the intrinsic semiconductor that is the third semiconductor to be vapor phase grown on the single crystal is also improved, the electrons are also difficult to trap in these semiconductors. As a result, highly efficiency electron emission is realized.

The diamond electron emission cathode in accordance with the present invention preferably has a columnar shape such that the length in the short side direction of the entire diamond including the electron emitting portion is 0.05 mm or more to 2 mm or less and the aspect ratio is 1 or more. With such a shape, the cathode can be easily mounted on an electron beam device such as electron microscope and electron beam exposure device. The "length in the short side direction" as referred to herein indicates a total width of the bottom section on the side opposite to the electron emitting portion of the diamond electron emission cathode. When the diamond electron emission cathode is a rectangular parallelepiped, this direction indicates a short side of the total width of the bottom section. The "aspect ratio" as referred to herein is a ratio of the length in the longitudinal direction to that in the short side direction, where the length from the tip end of the electron emitting portion to the bottom section on the opposite side is taken as the longitudinal direction.

In the diamond electron emission cathode in accordance with the present invention, at least one plane of the planes, which constitute the electron emitting portion as an apex in the sharpened acute section, is preferably formed by a (111) crystal plane [including off-planes within ±7° from the (111) just plane]. The stable growth plane in the vapor phase growth is a (100) plane or (111) plane, and the n-type impurity intake efficiency of the (111) plane in the vapor phase growth process is 10 or more times that of the (100) plane. It means that the (111) crystal plane of diamond enables high-concentration doping with n-type impurities, a metallic conduction can be easily obtained, and electron emission at a high current density can be obtained. Therefore, in the case where the electron emitting portion has a (111) crystal plane, a high-brightness electron emission cathode can be easily obtained.

In the diamond electron emission cathode in accordance with the present invention, a surface of the diamond constituting the electron emitting portion is preferably terminated with hydrogen atoms. By terminating the dangling bonds of the diamond surface with hydrogen atoms, the electron affinity is reduced. Alternatively, the effective work function is reduced. As a result, highly efficient electron emission is realized. Terminating 50% or more of the dangling bonds of the diamond surface of the electron emitting portion with hydrogen atoms is especially effective.

In the diamond electron emission cathode in accordance with the present invention, a portion comprising the n-type semiconductor preferably has a specific resistance of 300 Ωcm or less at 300 K (room temperature). In this case, electrons can be efficiently supplied to the portion comprising the n-type semiconductor. As a result, a high-density electron emission is possible and a high-brightness electron emission cathode can be obtained. The "specific resistance at room temperature" as referred to herein indicates a specific resistance in the vicinity of the electron emitting portion.

In the diamond electron emission cathode in accordance with the present invention, a tip end radius or a tip end curvature radius of the tip end portion having the electron emitting portion is preferably 30 μm or less. By making the tip end portion serving as the electron emitting portion in such a small size, an electron emission cathode with a higher brightness can be obtained.

In the diamond electron emission cathode in accordance with the present invention, it is preferred that the electron emitting portion have a protruding structure, a tip end diameter of the protrusion be 5 μm or less, and an aspect ratio thereof be 2 or more. When in the entire diamond single crystal serving as an electron emission cathode, only the electron emitting portion has such a sharpened acute shape, it is possible to realize a high-brightness diamond thermal field emission cathode or diamond field-emission cathode that can be easily mounted on an electron microscope, electron beam exposure device, or the like.

In the diamond electron emission cathode in accordance with the present invention, a temperature during electron emission is preferably 400 K or more to 1200 K or less. With the temperature within this range during electron emission, both the electron emission current and the service life can be improved over those of the conventional electron sources.

In the diamond electron emission cathode in accordance with the present invention, an electron beam with an energy width of 0.6 eV or less may be emitted. A diamond electron emission cathode with a good electron beam can be provided.

In the diamond electron emission cathode in accordance with the present invention, the heating section may have a metal layer. Because the presence of a metal layer decreases electric resistance, the source voltage used for heating can be decreased and the diamond electron emission cathode is suitable for mounting on electron beam devices such as electron microscopes and electron beam exposure devices.

As for the metal layer, the shortest distance from the electron emitting portion to an end portion of the metal layer may be 500 μm or less. Because the transport of electrons to the electron emitting portion is aided by the metal layer, a larger number of electrons can be transported to the electron emitting portion. As a result, high-efficiency electron emission is realized. The distance of 100 μm or less is even more preferred. With such a distance, the improvement of electron transport efficiency to the electron emitting portion attained by providing a metal coating on the electron emission cathode is even more significant.

A diamond electron emission source in accordance with the present invention is a structure for mounting the diamond electron emission cathode in accordance with the present invention on an electron microscope or electron beam exposure device, this structure comprising the diamond electron emission cathode in accordance with the present invention, an insulating ceramic, and a pair of terminals for supplying an electric current to the diamond electron emission cathode, wherein a resistance value between the terminals is preferably 10Ω or more to 3 kΩ or less. In this case, the diamond electron emission cathode in accordance with the present invention can be mounted without special modifications on the power source system of electron beam devices where the conventional cathode materials have been used.

Alternatively a diamond electron emission source in accordance with the present invention is a structure for mounting the diamond electron emission cathode in accordance with the present invention, which has a metal layer or a metal coating, on an electron microscope or electron beam exposure device, this structure comprising the diamond electron emission cathode in accordance with the present invention, an insulating ceramic, and a pair of terminals for supplying an electric current to the diamond electron emission cathode, wherein a resistance value between the terminals is preferably 10Ω or more to 700Ω or less. In this case, the diamond electron emission cathode in accordance with the present invention can be mounted without special modifications on the power source system of electron beam devices where the conventional cathode materials have been used and an electron emission source can be obtained which has a brightness higher than that attained with the diamond electron emission cathode without the metal layer.

Further, a diamond electron emission source in accordance with the present invention is a structure for mounting the diamond electron emission cathode in accordance with the present invention on an electron microscope or electron beam exposure device, this structure comprising the diamond electron emission cathode in accordance with the present invention, an insulating ceramic, and a pair of support terminals that clamp the diamond electron emission cathode, fix it to the insulating ceramic, and supply an electric current to the diamond electron emission cathode, wherein the support terminals are brought into direct contact with the diamond electron emission cathode.

In such diamond electron emission source, the diamond electron emission cathode, which is a novel cathode material, can be easily installed as a replacement in the electron beam devices that have been using W filaments, $LaB_6$, or sharpened W, ZrO/W, which are the conventional cathode materials. Moreover, due to the structure in which the support terminals directly clamp the diamond electron emission cathode, the optical axes can be easily aligned during fabrication of the diamond electron emission source and the possibility of displacement or separation during use is very low.

The melting point of a metal used for the pair of terminals or support terminals in the diamond electron emission source in accordance with the present invention is preferably 1700 K or less. Because electron emission from diamond is possible at a temperature lower than that of W filaments, $LaB_6$, or ZrO/W, a metal with a low melting point can be used and an electron emission source can be constructed by using a low-cost metal material.

An electron microscope in accordance with the present invention is installed with the diamond electron emission cathode or diamond electron emission source in accordance with the present invention. Because the diamond electron emission cathode or diamond electron emission source in accordance with the present invention makes it possible to obtain an electron beam with a high current density, high brightness, and low energy width, observations can be performed at a magnification ratio higher than that in the electron microscopes using the conventional cathode materials.

An electron beam exposure device in accordance with the present invention is installed with the diamond electron emission cathode or diamond electron emission source in accordance with the present invention. Because the diamond electron emission cathode or diamond electron emission source in accordance with the present invention makes it possible to obtain an electron beam with a high current density, high brightness, and low energy width, a fine pattern can be drawn at a higher throughput than in the electron beam exposure devices using the conventional cathode material.

Effect of the Invention

With the present invention, it is possible to realize a high-efficiency electron emission cathode and electron emission source that is suitable for devices of all types using electron beams, such as vacuum tubes, electron beam analyzers, accelerators, electron beam irradiation devices for sterilization, X-ray generators, irradiation devices for resins, and electron beam heating devices. In particular, it is possible to realize an electron emission cathode and electron emission source that use diamond, have a high brightness and a small energy width and are suitable for electron microscopes and electron beam exposure devices. Furthermore, by using the electron emission cathode and electron emission source, it is possible to realize an electron microscope enabling high-magnification observations and an electron beam exposure device in which fine patterns can be drawn at a high throughput.

BEST MODE FOR CARRYING OUT THE INVENTION

The preferred modes for carrying out the diamond electron emission cathode, electron emission source, electron microscope, and electron beam exposure device in accordance with the present invention will be described hereinbelow in greater detail with reference to the appended drawings. In the explanation of the drawings, identical elements will be assigned with identical reference symbols and the redundant explanation will be avoided. The dimensional ratio in the drawings does not necessarily match that in the description.

FIG. 1 is a perspective view illustrating an embodiment of the diamond electron emission cathode in accordance with the present invention. The diamond electron emission cathode 10 uses single crystal diamond in at least part thereof. A natural single crystal, a single crystal artificially synthesized by a high-temperature high-pressure synthesis method or vapor phase synthesis method, or a combination of such single crystals may be used as the single crystal diamond. The diamond electron emission cathode 10 is composed of two types of semiconductors. In one of the types, an n-type semiconductor diamond 11 is used as a first semiconductor, and in another one, a p-type semiconductor diamond 12 is used as a second semiconductor. The formation of the n-type semiconductor diamond 11 is preferably performed by using a single crystal diamond for the p-type semiconductor diamond 12 and performing epitaxial growth by a vapor phase growth method thereupon in order to decrease the difference between individual species or spread in conduction characteristics of the diamond that produces a significant effect on the electron emission characteristic. In such case, it is possible to control the doping concentration of n-type impurities that are necessary for using a diamond as a cathode material. Furthermore, because of a structure in which the semiconductors are joined together, the exchange of heat and electrons can be performed with good efficiency and electron emission with good efficiency is realized. Conducting growth by a microwave plasma CVD method is advantageous in terms of controlling the impurity concentration with high accuracy. The n-type semiconductor diamond 11 comprises n-type impurities at $2 \times 10^{15}$ cm$^{-3}$ or higher. In such a case, the electrons located in the conduction band of diamond are emitted. Therefore, the effective work function is low, electron emission can be conducted with a high current density, and an electron emission cathode with a high brightness is obtained. In order to obtain an electron emission cathode with even higher brightness, the concentration of n-type impurities is preferably $2 \times 10^{19}$ cm$^{-3}$ or higher. When the impurities are contained at such a high concentration, the distance between the donors in the diamond crystal becomes extremely small, and the electric conduction mechanism in the n-type semiconductor diamond 11 starts making a transition from the semiconductor conduction to metal conduction.

As a result, because the room-temperature resistance starts to decrease abruptly, the voltage drop at the diamond electron emission cathode itself during electron emission decreases. Therefore, electron emission with a higher current density becomes possible and a high-brightness electron emission cathode is obtained. At this time, for example, P or S is used as the n-type impurity element. For example, $H_2$ or $CH_4$ is used as a starting material gas employed for gas phase growth, and $PH_3$ or $H_2S$ is used as a doping gas. The synthesis can be performed under the following conditions. Thus, in the case of P doping, the ratio between the numbers of C atoms and H atoms in the gas phase is C/H=0.005 to 10% and the ratio between the numbers of P atoms and C atoms is P/C=$10^{-4}$ to 100%. In the case of S doping, C/H=0.005 to 10% and the ratio between the numbers of S atoms and C atoms is S/C=$10^{-2}$ to 100%. The temperature conditions are 600 to 1300° C. for both P and S doping.

The diamond electron emission cathode 10 has a sharpened acute section having a portion for electron emission, that is, the electron emitting portion 13, and a heating section 14. The sharpened acute section having the electron emitting portion 13 preferably has a shape of a polygonal pyramid such as quadrangular pyramid and triangular pyramid or a cone. In the case of a triangular pyramid, the pattern of emitted electrons (emission pattern) is, for example, in the form shown in FIG. 17. The heating section 14 is mainly composed of the p-type semiconductor diamond 12, which is the second semiconductor, and it is preferred that a semiconductor with a low specific resistance be selected so that the n-type semiconductor diamond 11, which is the first semiconductor, can be heated with good efficiency. B is preferably selected as the p-type impurity, and the p-type semiconductor with a p-type impurity concentration of $2 \times 10^{15}$ cm$^{-3}$ or higher can be used. More specifically, the low specific resistance is 300 Ωcm or less, more preferably 1 Ωcm or less. Using a semiconductor with a low specific resistance decreases the specific resistance of the entire electron emission cathode. Therefore, when the cathode is used at the same temperature as that of the electron emission cathode with a comparatively high specific resistance, the current for resistance heating can be increased. Therefore, the number of electrons reaching the electron emitting portion is advantageously increased. As a result, the electron emission efficiency is increased. The p-type semiconductor diamond 12 is preferably a single crystal diamond synthesizes by vapor phase growth. A single crystal diamond obtained by high-temperature high-pressure growth can be also used. However, because the vapor-phase grown crystal has a comparatively small amount of impurities other than p-type impurities and high quality, the crystallinity of the n-type semiconductor diamond 11 that is vapor phase grown on the single crystal diamond is also improved. As a result, the electrons are difficult to trap.

Therefore, high-efficiency electron emission is realized. The heating section 14 has a structure that can be clamped with a pair of current introducing terminals, so that direct heating by current conduction can be performed. The electron emitting portion 13 is heated by the heat generated by the heating section 14, and removal of moisture or the like that adhered to the surface of the electron emitting portion is also performed; this removal is necessary to stabilize the emission current. This effect is obtained at a temperature of the electron emitting portion 13 of 400 K or higher, but a temperature of 600 K or higher is preferred to activate further the donors of the n-type semiconductor diamond 11 and increase the electron emission efficiency. If the service life is taken into account, a temperature of 1200 K or less is preferred. If the temperature is less than 400 K, a stable electron emission current enabling a sufficient brightness cannot be obtained, and if the temperature is higher than 1200 K, a sufficient service life cannot be obtained. Because the sharpened acute section having the electron emitting portion 13 is present only in one location in the diamond electron emission cathode, a high-brightness diamond electron emission cathode can be fabricated. Furthermore, because the heating section is heated with a pair of current introducing terminals and some of the introduced electrons are emitted from the electron emitting portion, the diamond electron emission cathode can be advantageously used in electron beam devices such as electron microscopes and electron beam exposure devices. The electron emitting portion 13 of the diamond electron emission cathode 10 is composed of the n-type semiconductor diamond 11, which is the first semiconductor, but it is preferred that the surface of the n-type semiconductor diamond 11 be terminated with hydrogen atoms. In this case, the effective work function is decreased. Therefore, high-efficiency electron emission is realized. An even more significant effect can be demonstrated if 50% or more of the dangling bonds of the surface of the n-type semiconductor diamond 11 of the electron emitting portion 13 are terminated with hydrogen atoms.

FIG. 2 is a three-plane view of the diamond electron emission cathode shown in FIG. 1. FIG. 2(a) is a plan view, (b) is a front view, and (c) is a right side view. The diamond electron emission cathode 10 shown in FIG. 2 has an electron emitting portion 13 and a heating section 14 and is composed of the n-type semiconductor diamond 11 comprising n-type impurities at $2 \times 10^{15}$ cm$^{-3}$ or higher as the first semiconductor and the p-type semiconductor diamond 12 comprising p-type impurities at $2 \times 10^{15}$ cm$^{-3}$ or higher as the second semiconductor. The electron emitting portion 13 is n-type semiconductor diamond 11, which is the first semiconductor. The n-type semiconductor diamond 11 and p-type semiconductor diamond 12 are joined by the junction surface 15.

FIG. 3(a) is a bottom view of a structure in which the diamond electron emission cathode 10 is sandwiched between a pair of current introducing terminals 20, and FIG. 3(b) is a rear surface view thereof.

The two types of semiconductors assume the same electric potential, without application of bias voltage, if a pair of current introducing terminals 20, 20 that are necessary for electron emission are brought into contact with the n-type semiconductor diamond 11 and p-type semiconductor diamond 12 and a current for resistance heating is caused to flow parallel to the junction surface 15. Because the two semiconductors are under the same electric potential, the electrons are not moved between the two semiconductors by an electric field. Thus, annihilation of electrons by coupling of electrons and holes induced by electric field between a pair of current introducing terminals does not occur between the two types of semiconductors. Therefore, when the electron emitting portion 13 is composed of the n-type semiconductor diamond 11, which is the first semiconductor, the electrons supplied from the pair of current introducing terminals 20, 20 are transported to the electron emitting portion 13 and emitted into vacuum only by the first semiconductor, that is, the n-type semiconductor diamond 11 in which electrons are the major carrier. Therefore, high-efficiency electron emission is realized. In this case, the second semiconductor, that is, the p-type semiconductor diamond 12 is used as a resistor for resistance heating, the activation ratio of donors of the n-type semiconductor diamond 11 is increased by the heat and the number of electrons in the conduction band is increased, whereby high-efficiency electron emission is realized.

FIG. 4 is a perspective view illustrating another embodiment of the diamond electron emission cathode in accordance with the present invention. The diamond electron emission cathode 30 uses single crystal diamond in at least part thereof. A natural single crystal, a single crystal artificially synthesized by a high-temperature high-pressure synthesis method or vapor phase synthesis method, or a combination of such single crystals may be used as the single crystal diamond. The diamond electron emission cathode 30 is composed of two types of semiconductors. In one of them, an n-type semiconductor diamond 31 is used as a first semiconductor, and in another type, a p-type semiconductor diamond 32 is used as a second semiconductor. The formation of the n-type semiconductor diamond 31 is preferably performed by using a single crystal diamond for the p-type semiconductor diamond 32 and performing epitaxial growth by a vapor phase growth method thereupon in order to decrease the individual difference or spread in conduction characteristics of the diamond that produces a significant effect on the electron emission characteristic. In such case, it is possible to control the doping concentration of n-type impurities, this control being necessary for using a diamond for a cathode material. Furthermore, because of a structure in which the semiconductors are joined together, the exchange of heat and electrons can be performed with good efficiency and electron emission with good efficiency is realized. Conducting growth by a microwave plasma CVD method is advantageous in terms of controlling the impurity concentration with high accuracy. The n-type semiconductor diamond 31 comprises n-type impurities at $2 \times 10^{15}$ cm$^{-3}$ or higher. In such a case, the amount of electrons located in the conduction band of diamond becomes sufficiently large, electron emission can be conducted with a high current density, and an electron emission cathode with a high brightness is obtained. In order to obtain an electron emission cathode with even higher brightness, the concentration of n-type impurities is preferably $2 \times 10^{19}$ cm$^{-3}$ or higher. When the impurities are contained at such a high concentration, the distance between the donors in the diamond crystal becomes extremely small, and the electric conduction mechanism in the n-type semiconductor diamond 31 starts making a transition from the semiconductor conduction to metal conduction.

As a result, because the room-temperature resistance starts to decrease abruptly, the voltage drop at the diamond electron emission cathode itself during electron emission decreases. Therefore, electron emission with a higher current density becomes possible and a high-brightness electron emission cathode is obtained. At this time, for example, P or S is used as the n-type impurity element. For example, $H_2$ or $CH_4$ is used as a starting material gas employed for gas phase growth, and $PH_3$ or $H_2S$ is used as a doping gas. The synthesis can be performed under the following conditions. In the case of P doping, the ratio between the numbers of C atoms and H atoms in the gas phase is C/H=0.005 to 10% and the ratio between the numbers of P atoms and C atoms is P/C=$10^{-4}$ to 100%. In the case of S doping, C/H=0.005 to 10% and the ratio between the numbers of S atoms and C atoms is S/C=$10^{-2}$ to 100%. The temperature conditions are 600 to 1300° C. for both P and S doping.

The diamond electron emission cathode 30 has a portion for electron emission, that is, an electron emitting portion 33, and a heating section 34. The electron emitting portion 33 preferably has a shape of a polygonal pyramid such as quadrangular pyramid and triangular pyramid or a cone. The heating section 34 is mainly composed of a the p-type semiconductor diamond 32, which is the second semiconductor, and it is preferred that a semiconductor with a low specific resistance be selected so that an n-type semiconductor diamond 31, which is the first semiconductor, can be heated with good efficiency. B is preferably selected as the p-type impurity, and the p-type semiconductor with a p-type impurity concentration of $2 \times 10^{15}$ cm$^{-3}$ or higher can be used. More specifically, the low specific resistance is 300 Ωcm or less, more preferably 1 Ωcm or less. Using a semiconductor with a low specific resistance decreases the specific resistance of the entire electron emission cathode. Therefore, when the cathode is used at the same temperature as the electron emission cathode with a comparatively high specific resistance, the current for resistance heating can be increased. Therefore, the electrons reaching the electron emitting portion is increased. As a result, the electron emission efficiency is increased. The p-type semiconductor diamond 32 is preferably a single crystal diamond synthesizes by vapor phase growth. A single crystal diamond obtained by high-temperature high-pressure growth can be also used. However, because the vapor-phase grown crystal has a comparatively small amount of impurities other than p-type impurities and high quality, the crystallinity of the n-type semiconductor diamond 31 that is vapor phase grown on the single crystal diamond is also improved. As a result, the electrons are difficult to trap.

Therefore, high-efficiency electron emission is realized. The heating section 34 has a structure that can be clamped with a pair of current introducing terminals, so that direct heating by current conduction can be performed. The electron emitting portion 33 is heated by the heat generated by the heating section 34, and removal of moisture or the like that adhered to the surface of the electron emitting portion is also performed; this removal is necessary to stabilize the emission current. This effect is obtained at a temperature of the electron emitting portion 33 of 400 K or higher, but a temperature of 600 K or higher is preferred to activate further the donors of the n-type semiconductor diamond 31 and increase the electron emission efficiency. If the service life is taken into account, a temperature of 1200 K or less is preferred. If the temperature is less than 400 K, a stable electron emission current enabling a sufficient brightness cannot be obtained, and if the temperature is higher than 1200 K, a sufficient service life cannot be obtained. Because the sharpened acute section having the electron emitting portion 33 is present only in one location in the diamond electron emission cathode, a high-brightness diamond electron emission cathode can be fabricated. Furthermore, because the heating section is heated with a pair of current introducing terminals and some of the introduced electrons are emitted from the electron emitting portion, the diamond electron emission cathode can be advantageously used in electron beam devices such as electron microscopes and electron beam exposure devices. The electron emitting portion 33 of the diamond electron emission cathode 30 is composed of the p-type semiconductor diamond 32, which is the second semiconductor, but it is preferred that the surface of the p-type semiconductor diamond 32 be terminated with hydrogen atoms. In this case, the electron affinity is decreased. Therefore, high-efficiency electron emission is realized. An even more significant effect can be demonstrated if 50% or more of the dangling bonds of the surface of the p-type semiconductor diamond 32 of the electron emitting portion 33 are terminated with hydrogen atoms.

FIG. 5 is a three-plane view of the diamond electron emission cathode shown in FIG. 4. FIG. 5($a$) is a plan view, ($b$) is a front view, and ($c$) is a right side view.

The diamond electron emission cathode 30 shown in FIG. 5 has an electron emitting portion 33 and a heating section 34 and is composed of the n-type semiconductor diamond 31 comprising n-type impurities at $2 \times 10^{15}$ cm$^{-3}$ or higher as the first semiconductor and the p-type semiconductor diamond 32 comprising p-type impurities at $2 \times 10^{15}$ cm$^{-3}$ or higher as the second semiconductor. The electron emitting portion 31 is composed of the p-type semiconductor diamond 32, which is the second semiconductor. A semiconductor that has fewer electrons, but easier releases electrons into vacuum, that is, has a lower electron affinity than the n-type semiconductor diamond 31 is selected as the p-type semiconductor diamond 32. The n-type semiconductor diamond 31 and p-type semiconductor diamond 32 are joined by a junction surface 35. FIG. 6($a$) is a plan view seen from the top of the structure in which the diamond electron emission cathode 30 is sandwiched between a pair of current introducing terminals 40, 40, FIG. 6($b$) is a rear surface view thereof. The semiconductors of two types assume the same electric potential, without bias voltage application, if a pair of current introducing terminals 40, 40 that are necessary for electron emission are brought into contact with the n-type semiconductor diamond 31 and p-type semiconductor diamond 32 and a resistance heating current is caused to flow parallel to the junction surface 35. Because the two semiconductors are under the same electric potential, the electrons are not moved between the two semiconductors by an electric field. Thus, annihilation of electrons by coupling of electrons and holes induced by electric field between a pair of current introducing terminals does not occur between the two types of semiconductors. Usually, electrons are assumed to be moved from the n-type semiconductor diamond 31 into p-type semiconductor diamond 32 and emitted under the effect of bias voltage application. However, taking into account that electrons are consumed in the portion of bias voltage application, a method for moving the electrons, without applying a bias voltage, is necessary to cause the emission of a larger number of electrons into vacuum. The following measures were discovered to be suitable as such a method.

With the first measure, the temperature is raised, whereby alternating current of electrons between the semiconductors of two types is greatly intensified, causing diffusion, movement of electrons into the second semiconductor, and augmented emission effect. With the second measure, due to heating, the first semiconductor, that is, the n-type semiconductor diamond 31, is conductive, whereby the conduction becomes a driving force that facilitates the movement of electrons into the second semiconductor, that is, the p-type semiconductor diamond 32, and electron emission. The electrons that moved to the p-type semiconductor diamond 32 due to the diffusion in the vicinity of the acute electron emitting portion 33 are directly emitted from the electron emitting portion 33 into vacuum. Therefore, electron emission with a high current density is possible. In the vicinity of the acute electron emitting portion 33, the direction in which the electrons flow from the n-type semiconductor diamond 31 into the p-type semiconductor diamond 32 is almost identical to the direction in which electrons are emitted into vacuum. The fact that the electric current used for heating also serves for electron emission, thereby making it possible to obtain an electron emission cathode with a brightness higher than that of the conventional cathodes, was heretofore difficult to establish because such current becomes the cause of noise generation that spreads the energy width of emitted electrons and provides an adverse effect. However, the results of the comprehensive research conducted by the inventors demonstrated that electric current and voltage for heating and electron emission are stabilized by the resistance of the portion that is provided for heating and that the emitted electrons are filtered according to their energy, and these effects were found to surpass greatly the inverse effect.

FIG. 7 is a perspective view illustrating another embodiment of the diamond electron emission cathode in accordance with the present invention. The diamond electron emission cathode 50 uses single crystal diamond in at least part thereof. A natural single crystal, a single crystal artificially synthesized by a high-temperature high-pressure synthesis method or vapor phase synthesis method, or a combination of such single crystals may be used as the single crystal diamond. The diamond electron emission cathode 50 is composed of three types of semiconductors. In one type, an n-type semiconductor diamond 51 is used as the first semiconductor, in another type, a p-type semiconductor diamond 52 is used as the second semiconductor, and in yet another type, an intrinsic semiconductor diamond 53 is used as the third semiconductor. The n-type semiconductor diamond 51, which is the first semiconductor, is joined to the p-type semiconductor diamond 52, which is the second semiconductor, via the intrinsic semiconductor diamond 53, which is the third semiconductor. The semiconductor configuration is preferably obtained by successively epitaxially growing the intrinsic semiconductor diamond 53 and n-type semiconductor diamond 51 in this order on the p-type semiconductor diamond 52 by a vapor phase growth method. With such a procedure, the individual difference or spread in conduction characteristics of the diamond that produces a significant effect on the electron emission characteristic in the n-type semiconductor diamond 51 and intrinsic semiconductor diamond 53 can be reduced and the doping concentration of n-type impurities that are necessary for using a diamond as a cathode material can be controlled. Furthermore, because a pin-junction structure is produced, the exchange of heat and electrons can be performed with good efficiency and the number of electrons annihilated by coupling with holes can be reduced to zero. Therefore, electron emission with even higher efficiency is realized. The thickness of the intrinsic semiconductor diamond 53 is preferably 0.01 μm to 10 μm. With the thickness within a range of 0.01 μm to 10 μm, the above-described effect can be sufficiently demonstrated. If the thickness is less than 9.01 μm, the number of electrons annihilated due to coupling with holes is rapidly increased. If the thickness is more than 10 μm, the resistance of the diamond electron emission cathode 50 increases, the number of electrons present in the conduction band of diamond decreases, and electron emission capacity decreases.

Conducting growth by a microwave plasma CVD method is advantageous in terms of controlling the concentration of impurities in the n-type semiconductor diamond 51 and intrinsic semiconductor diamond 53 with high accuracy. The n-type semiconductor diamond 51 comprises n-type impurities at $2\times10^{15}$ cm$^{-3}$ or higher. In such a case, the number of electrons located in the conduction band of diamond becomes sufficiently large, electron emission can be conducted with a high current density, and an electron emission cathode with a high brightness is obtained. In order to obtain an electron emission cathode with even higher brightness, the concentration of n-type impurities is preferably $2\times10^{19}$ cm$^{-3}$ or higher. When the impurities are contained at such a high concentration, the distance between the donors in the diamond crystal becomes extremely small, and the electric conduction mechanism in the n-type semiconductor diamond 51 starts making a transition from the semiconductor conduction to metal conduction.

As a result, because the room-temperature resistance starts to decrease abruptly, the voltage drop at the diamond electron emission cathode itself during electron emission decreases. Therefore, electron emission with a higher current density becomes possible and a high-brightness electron emission cathode is obtained. At this time, for example, P or S is used as the n-type impurity element. For example, $H_2$ or $CH_4$ is used as a starting material gas employed for gas phase growth, and $PH_3$ or $H_2S$ is used as a doping gas. The synthesis can be performed under the following conditions. Thus, in the case of P doping, the ratio between the numbers of C atoms and H atoms in the gas phase is C/H=0.005 to 10% and the ratio between the numbers of P atoms and C atoms is P/C=$10^{-4}$ to 100%. In the case of S doping, C/H=0.005 to 10% and the ratio of the numbers of S atoms and C atoms is S/C=$10^{-2}$ to 100%. The temperature conditions are 600 to 1300° C. for both P and S doping.

The intrinsic semiconductor diamond 53 has a carrier concentration of $1\times10^9$ cm$^{-3}$ or lower. Because of such high purity, practically no electrons annihilate by coupling with holes and electron emission with even higher efficiency is realized. For example, high-purity $H_2$ or $CH_4$ is used as the starting material gas employed for vapor phase growth.

The diamond electron emission cathode 50 has a portion for electron emission, that is, an electron emitting portion 54, and a heating section 55. The electron emitting portion 54 preferably has a shape of a polygonal pyramid such as quadrangular pyramid and triangular pyramid or a cone. The heating section 55 is mainly composed of a the p-type semiconductor diamond 52, which is the second semiconductor, and it is preferred that a semiconductor with a low specific resistance be selected so that an n-type semiconductor diamond 51, which is the first semiconductor, can be heated with good efficiency. B is preferably selected as the p-type impurity, and the p-type semiconductor with a p-type impurity concentration of $2\times10^{15}$ cm$^{-3}$ or higher can be used. More specifically, the low specific resistance is 300 Ωcm or less, more preferably 1 Ωcm or less. Using a semiconductor with a low specific resistance decreases the specific resistance of the entire electron emission cathode. Therefore, when the cathode is used at the same temperature as the electron emission cathode with a comparatively high specific resistance, the current for resistance heating can be increased. Therefore, the electrons reaching the electron emitting portion is increased. As a result, the electron emission efficiency is increased. The p-type semiconductor diamond 52 is preferably a single crystal diamond synthesizes by vapor phase growth. A single crystal diamond obtained by high-temperature high-pressure growth can be also used. However, because the vapor-phase grown crystal has a comparatively small inclusion of impurities other than p-type impurities and high quality, the crystallinity of the n-type semiconductor diamond 51 and the intrinsic semiconductor diamond 53 which are vapor phase grown on the single crystal diamond is also improved. As a result, the electrons are difficult to trap.

Therefore, high-efficiency electron emission is realized. The heating section 55 has a structure that can be clamped with a pair of current introducing terminals, so that direct heating by current conduction can be performed. The electron emitting portion 54 is heated by the heat generated by the heating section 55, and removal of moisture or the like that adhered to the surface of the electron emitting portion is also performed; this removal is necessary to stabilize the emission current. This effect is obtained at a temperature of the electron emitting portion 54 of 400 K or higher, but a temperature of 600 K or higher is preferred to activate further the donors of the n-type semiconductor diamond 51 and increase the electron emission efficiency. If the service life is taken into account, a temperature of 1200 K or less is preferred. If the temperature is less than 400 K, a stable electron emission current enabling a sufficient brightness cannot be obtained, and if the temperature is higher than 1200 K, a sufficient service life cannot be obtained. Because the sharpened acute section having the electron emitting portion 54 is present only in one location in the diamond electron emission cathode, a high-brightness diamond electron emission cathode can be fabricated. Furthermore, because the heating section is heated with a pair of current introducing terminals and some of the introduced electrons are emitted from the electron emitting portion, the diamond electron emission cathode can be advantageously used in electron beam devices such as electron microscopes and electron beam exposure devices. The electron emitting portion 54 of the diamond electron emission cathode 50 is composed of the intrinsic semiconductor diamond 53, which is the third semiconductor, but it is preferred that the surface of the intrinsic semiconductor diamond 53 be terminated with hydrogen atoms. In this case, the electron affinity is decreased. Therefore, high-efficiency electron emission is realized. An even more significant effect can be demonstrated if 50% or more of the dangling bonds of the surface of the intrinsic semiconductor diamond 53 of the electron emitting portion 54 are terminated with hydrogen atoms.

FIG. 8 is a three-plane view of the diamond electron emission cathode shown in FIG. 7. FIG. 8(a) is a plan view, (b) is a front view, and (c) is a right side view.

The diamond electron emission cathode 50 shown in FIG. 8 has an electron emitting portion 54 and a heating section 55 and is composed of an n-type semiconductor diamond 51 comprising n-type impurities at $2 \times 10^{15}$ cm$^{-3}$ or higher as the first semiconductor, a p-type semiconductor diamond 52 comprising p-type impurities at $2 \times 10^{15}$ cm$^{-3}$ or higher as the second semiconductor, and an intrinsic semiconductor diamond 53 with a carrier concentration of $1 \times 10^9$ cm$^{-3}$ or lower as a third semiconductor. The electron emitting portion 54 is composed of the intrinsic semiconductor diamond 53, which is the third semiconductor. A semiconductor that has fewer electrons, but easier releases electrons into vacuum, that is, has a lower electron affinity than the n-type semiconductor diamond 51 is selected as the intrinsic semiconductor diamond 53. The n-type semiconductor diamond 51 and p-type semiconductor diamond 52 are joined via the intrinsic semiconductor diamond 53 and a pin junction section 56 is formed.

FIG. 9(*a*) is a bottom view of a structure in which the diamond electron emission cathode 50 is sandwiched between a pair of current introducing terminals 60, 60, FIG. 9(*b*) is a rear surface view thereof. The n-type semiconductor diamond 51 and p-type semiconductor diamond 52 assume the same electric potential, without bias voltage application, if a pair of current introducing terminals 60, 60 that are necessary for electron emission are brought into contact with the n-type semiconductor diamond 51, p-type semiconductor diamond 52, and intrinsic semiconductor diamond 53 and the current for resistance heating is caused to flow parallel to the pin junction section 56. Because the two semiconductors are under the same electric potential, the electrons are not moved between the two semiconductors by an electric field. Thus, annihilation of electrons by coupling of electrons and holes induced by electric field between a pair of current introducing terminals does not occur between the two types of semiconductors. However, by raising the temperature of the diamond electron emission cathode 50, the exchange of electrons between the n-type semiconductor diamond 51 and intrinsic semiconductor diamond 53 is greatly intensified, causing diffusion, movement of electrons into the third semiconductor, that is, the intrinsic semiconductor diamond 53, and augmented emission effect. Furthermore, due to heating, the first semiconductor, that is, the n-type semiconductor diamond 51 is conductive, whereby the conduction becomes a driving force that facilitates the movement of electrons into the third semiconductor, that is, the intrinsic semiconductor diamond 53 and electron emission. The electrons that moved to the intrinsic semiconductor diamond 53 due to the diffusion in the vicinity of the sharpened acute electron emitting portion 54 are directly emitted from the electron emitting portion 54 into vacuum.

Therefore, electron emission with a high current density is possible. In the vicinity of the sharpened acute electron emitting portion 54, the direction in which the electrons flow from the n-type semiconductor diamond 51 into the intrinsic semiconductor diamond 53 is almost identical to the direction in which electrons are emitted into vacuum. In this case, the second semiconductor, that is, the p-type semiconductor diamond 52 is used as a resistor for resistance heating, the activation rate of donors in the n-type semiconductor diamond 51 by heat is increased, and the number of electrons in the conduction band is increased, whereby a highly efficient electron emission is realized. The results of the comprehensive research conducted by the inventors demonstrated that when the third semiconductor, that is, the intrinsic semiconductor diamond 53, is used for the electron emitting portion 54, the annihilation of electrons by coupling of electrons and holes in the electron emitting portion 54 can be greatly reduced by comparison with the case where the second semiconductor, that is, the p-type semiconductor diamond 52, is used, electron emission with even higher current density is made possible, and a high-brightness electron emission cathode is obtained.

It is preferred that at least one plane of the planes for which at least the sharpened electron emitting portion 13, electron emitting portion 33, and electron emitting portion 54 is formed as an apex in the surfaces of the diamond electron emission cathode 10, diamond electron emission cathode 30, and diamond electron emission cathode 50 be formed by a (111) crystal plane. The stable growth plane in vapor phase growth is a (100) plane or (111) plane, but the intake efficiency of n-type impurities such as P or S of the (111) plane in the vapor phase growth process is two or more times that of the (100) plane. Therefore, by performing high-concentration doping of n-type impurities at the (111) plane of diamond, it is possible to realize easily electron emission with a high current density based on metallic conduction, that is, a high-brightness electron emission cathode. In the advantageous shape of the electron emitting portion comprising the (111) surface, all four planes constituting the sharpened acute section 71 such as shown in the plan view of FIG. 10 are (111) planes, or two planes of the three planes constituting the sharpened acute section 81 such as shown in the plan view of FIG. 11 are (111) planes, but even one plane of the planes constituting the sharpened acute section may be the (111) planes. The (111) plane, as referred to herein, includes off-planes within ±7° from the (111) just plane. Within this range, high-concentration doping of n-type impurities can be attained. Examples of methods that can be advantageously used for forming the (111) planes include polishing, laser machining, ion etching, growth, or combinations thereof.

The diamond electron emission cathode shown in FIG. 1 to FIG. 14 is in a columnar shape with a length in the short side direction of 0.05 mm or more to 2 mm or less and an aspect ratio of 1 or more so that the electron emission cathode can be installed in an electron gun chamber produced as an electron extraction structure of an electron microscope or electron beam exposure device. If the length in the short side direction is less than 0.05 mm, when the diamond electron source is used at a high temperature, due to thermal expansion of the metal used for clamping in a tool employed for mounting the diamond electron source, it is highly probable that the diamond electron source will fall out from the tool, and if the length in the short side direction is more than 2 mm, the electron emission noise from the outside of the electron emission portion that decreases the brightness of the obtained electron beam becomes significant, and this noise is difficult to suppress with the suppressor of the electron gun chamber. If the aspect ratio is less than 1, even the electrons emitted from the electron emitting portion are suppressed with the suppressor and a high-brightness electron beam is difficult to obtain.

The specific resistance of the portion of the diamond electron emission cathode containing n-type impurities at room temperature is preferably 300 Ωcm or less. In this case, electrons can be effectively supplied to the portion containing n-type impurities, high-density electron emission is possible, and a high brightness electron emission cathode can be obtained.

The tip end radius or tip end curvature radius of the sharpened acute section having the electron emitting portion of the diamond electron emission cathode shown in FIGS. 1 to 11 and FIGS. 13 and 14 is preferably 30 μm or less. By making the tip end of the electron emitting portion of such a small size, an electron emission cathode with a higher brightness can be obtained. Furthermore, a smaller focusing point can be maintained when the tip is used as a tip for thermal electron emission. If the tip end radius or tip end curvature radius is more than 30 µm, the focal point is very difficult to decrease in size and special attention should be paid to the optical system of the electron beam device. In order to obtain a sharp tip end, it is preferred that the first semiconductor, that is, the n-type semiconductor diamond, the second semiconductor, that is, the p-type semiconductor diamond, and the third semiconductor, that is, the intrinsic semiconductor diamond be grown by vapor phase synthesis and then subjected to polishing or ion etching. Furthermore, if the tip end radius is 5 µm or less, an electric field of $10^4$ V/cm or more can be easily obtained at the tip end of the electron emitting portion which is a threshold at which the cathode can be advantageously used as a thermal field electron emission cathode. Even more preferred that the tip end diameter be 1 µm or less. In this case, an electric field of $10^7$ V/cm or more can be easily obtained at the tip end of the electron emitting portion and, therefore, the cathode can be advantageously used as a field-emission cathode.

Furthermore, the electron emitting portion such as shown in FIG. 12 may have a protruding structure 92 at the tip end of the sharpened acute section 91 in which the tip end diameter of the protrusion is 5 µm or less and the aspect ratio is 2 or more. In order to obtain such a sharpened acute end, it is preferred that the first semiconductor, that is, the n-type semiconductor diamond, the second semiconductor, that is, the p-type semiconductor diamond, and the third semiconductor, that is, the intrinsic semiconductor diamond be grown by vapor phase synthesis and then subjected to sharpening by ion etching. If only the electron emitting portion of the entire diamond serving as an electron emission cathode has such a sharpened acute shape, then the cathode can be easily mounted on an electron microscope or electron beam exposure device. If the tip end diameter is 5 µm or less, the cathode can be advantageously used as a high-brightness thermal filed emission cathode, and if the tip end diameter is 1 µm or less, the cathode can be advantageously used as a high-brightness field-emission cathode.

Emitting an electron beam with an energy width of 0.6 eV or less under an applied voltage of 0.5 kV or more to 100 kV or less also may be a specific feature of the diamond electron emission cathode in accordance with the present invention. Such diamond electron emission cathode as a replacement for cathodes from the conventional materials can provide a good electron beam. For example, the results of energy analysis of the electron beam emitted from the diamond electron emission cathode are shown in FIG. 18. These results clearly show that the peak has an asymmetrical shape with a tail drawn to the high-energy side.

Alternatively, as shown in FIG. 13, the heating section 101 may have a metal layer 102. Because the presence of a metal layer 102 decreases electric resistance, the source voltage used for heating can be decreased and the diamond electron emission cathode is suitable for mounting on electron beam devices such as electron microscopes and electron beam exposure devices. A metal with a high melting point such as Mo, Nb, W, Ta or a metal such as Ti can be advantageously used for the metal layer 102.

Further, as shown in FIG. 14, metal coating with the metal coating layer 113 may be conducted so that the shortest distance (l) from the electron emitting portion 112 to an end portion of the metal layer, including the heating section 111, is 500 µm or less. Because the transport of electrons to the electron emitting portion is aided by the metal coating layer, a larger number of electrons can be transported to the electron emitting portion. As a result, high-efficiency electron emission is realized. It is even more preferred that the distance (l) be 100 µm or less. With such a distance the improvement of electron transport efficiency to the electron emitting portion attained by providing a metal coating on the electron emission cathode is even more significant. Aid to transport electrons by the metal coating layer cannot be accomplished when the distance (l) is more than 500 µm.

FIG. 15 is a cross-sectional view of a diamond electron emission source in accordance with the present invention. The diamond electron emission cathode is shown in a plan view. The diamond electron emission source has a structure comprising the diamond electron emission cathode 120 in accordance with the present invention that has no metal layer or metal coating, an insulating ceramic 121, and a pair of support terminals (current introducing terminals) 122, 122 for supplying an electric current to the diamond electron emission cathode 120, wherein the support terminals 122, 122 are in direct contact with the diamond electron emission cathode 120. When the electric resistance value between the terminals is 10Ω or more to 3 kΩ or less, the performance of the diamond electron emission source can be fully demonstrated with a power source system of an electron beam device where the conventional cathode materials have been used.

FIG. 16 is a cross-sectional view of another diamond electron emission source in accordance with the present invention. The diamond electron emission cathode is shown in a plan view. The diamond electron emission source has a structure comprising the diamond electron emission cathode 130 in accordance with the present invention that has a metal layer or metal coating, an insulating ceramic 131, and a pair of support terminals (current introducing terminals) 132, 132 for supplying an electric current to the diamond electron emission cathode 130, wherein the support terminals 132, 132 are in direct contact with the diamond electron emission cathode 130. When the electric resistance value between the terminals is 10Ω or more to 700Ω or less, the diamond electron emission cathode in accordance with the present invention can be mounted without special modifications on the power source system of electron beam devices where the conventional cathode materials have been used and an electron emission source can be obtained which has a brightness higher than that attained with the diamond electron emission cathode without the metal layer.

A metal with a high melting point such as Mo, Nb, W, Ta, or alloys thereof can be advantageously used as a material for the supporting terminals. Alternatively, even a metal with a melting point of 1700 K or less can be advantageously used for the support terminals. Because diamond can emit electrons at a lower temperature than W filaments, $LaB_6$, or ZrO/W, a metal with a low melting point can be used. In this case, a low-cost metal material can be used and an electron emission source can be constructed at a low cost. Because the diamond electron emission cathode does not react with the support terminals as, for example, hexaborides such as $LaB_6$ do, even at a high temperature under electron emission, the cathode can be clamped by direct contact. With the above-described structure of the diamond electron emission source, the diamond electron emission source may be installed very easily as a replacement in electron beam devices where W filaments, $LaB_6$, or sharpened W, ZrO/W, which are the conventional cathode materials have been used. Moreover, because of a structure in which the diamond electron emission cathode is directly clamped by the support terminals, the alignment of optical axes during fabrication is facilitated and the possibility of displacement or separation during use is low. Furthermore, an electric resistance of 3 kΩ or less between the terminals at room temperature is desirable for attaching the diamond electron emission cathode to an electron beam devices where the conventional cathode materials were used. At a higher resistance value, there is a strong possibility that sufficient electron emission characteristics will not be obtained with the power source of the electron beam device.

The electron microscope in accordance with the present invention has installed therein the diamond electron emission cathode or diamond electron emission source in accordance with the present invention and enables observations at a higher magnification ratio than the electron microscopes using the conventional cathode materials. When the diamond electron emission cathode in accordance with the present invention is so shaped that it can be used as a thermal electron emission cathode and installed in an electron microscope, observations of fine configurations can be performed at a magnification ratio higher than that attained when $LaB_6$ is used. When the diamond electron emission cathode is so shaped that it can be used as a thermal field-emission cathode and installed in an electron microscope, observations of fine configurations can be performed at a magnification ratio higher than that attained when ZrO/W is used. Alternatively, when the diamond electron emission cathode is so shaped that it can be used as a field-emission cathode and installed in an electron microscope, observations of fine configurations can be performed at a magnification ratio higher than that attained when sharpened W is used.

The electron beam exposure device in accordance with the present invention has installed therein the diamond electron emission cathode or diamond electron emission source in accordance with the present invention and enables the drawing of fine patterns with a throughput higher than that of electron beam exposure devices using the conventional cathode materials. When the diamond electron emission cathode in accordance with the present invention is so shaped that it can be used as a thermal electron emission cathode and installed in an electron beam exposure device, fine patterns can be drawn with a throughput higher than that attained when $LaB_6$ is used. When the diamond electron emission cathode is so shaped that it can be used as a thermal field-emission cathode and installed in an electron beam exposure device, fine patterns can be drawn with a throughput higher than that attained when ZrO/W is used.

EXAMPLES

Example 1

The diamond electron emission cathode, electron emission source, electron microscope, and electron beam exposure device in accordance with the present invention will be described below in greater detail based on Examples thereof.

The samples with numbers (1) to (23) were fabricated as diamond electron emission cathodes. All the samples had a size of 0.6 mm×0.6 mm×2.5 mmt and an aspect ratio of about 4.2. A single crystal p-type semiconductor diamond synthesized by vapor phase growth was prepared as the second semiconductor and shaped by laser machining and polishing. Then, the second semiconductor was used as a substrate and an n-type semiconductor diamond that is the first semiconductor, or an intrinsic semiconductor diamond that is the third semiconductor was epitaxially grown thereupon by vapor phase growth. The p-type impurity of the p-type semiconductor diamond was boron. Single crystals with a B concentration of $4\times10^{19}$ cm$^{-3}$ were used for all the samples. The samples with numbers (1), (4), (5), (8), (9), (12), (13), (16), (17) to (23) were used to fabricate diamond electron emission cathodes such as the cathode shown in FIG. 1, the samples with numbers (2), (6), (10), (14) were used to fabricate diamond electron emission cathodes such as the cathode shown in FIG. 4, and the samples with numbers (3), (7), (11), (15) were used to fabricate diamond electron emission cathodes such as the cathode shown in FIG. 7. The epitaxial growth was conducted so that the concentration of carriers in the intrinsic semiconductor diamond at 300 K was $1\times10^9$ cm$^{-3}$ or less. The n-type impurity of the n-type semiconductor diamond was P.

For the samples with numbers (1) to (8), (17) to (23), the n-type semiconductor diamonds were synthesized under the same conditions, and in the samples with numbers (4) and (8) in which the (111) crystal plane was the plane at the electron emitting portion as an apex, P was doped to a high concentration and a low specific resistance was obtained at 300 K. For the samples with numbers (9) to (16), the n-type semiconductor diamonds were synthesized under the another same conditions, and in samples with numbers (12) and (16) in which the (111) crystal plane was the plane at the electron emitting portion as an apex, P was doped to a high concentration and a low specific resistance was obtained at 300 K. The samples with numbers (1) to (4), (9) to (12), (17) to (23), were annealed in the atmosphere, and hydrogen termination at the electron emitting portions were completely removed. The tip end curvature radius of the diamond electron emission cathode was 30 μm in the sample with number (17) and 40 μm in the sample with number (18). In the other samples, the curvature radius was 10 μm. All the fabricated diamond electron emission cathodes were used in diamond electron emission sources having Mo support terminals (current introducing terminals) such as shown in FIG. 15, and the electron emission characteristic and electron beam characteristic were initially evaluated without a metal layer. Then, a metal layer was formed from Mo, as shown in FIG. 13, on the diamond electron emission cathodes and the cathodes were evaluated in the diamond electron emission sources with Mo support terminals such as shown in FIG. 16. The diamond electron emission cathodes were then provided with a metal coating as far as the distance of 300 μm from the tip end of the electron emitting portion by using Mo, as shown in FIG. 14, and the cathodes were evaluated in the diamond electron emission sources with Mo support terminals such as shown in FIG. 16. For the evaluation, the diamond electron emission cathodes were clamped with the support terminals as shown in FIG. 3, FIG. 6, and FIG. 9. In the evaluation, the resistance between the terminals for the diamond electron emission cathode at the evaluation temperature was measured and then the beam energy width, emission current value, initial brightness, and service life were measured. The service life was taken as an interval in which the brightness decreased to ⅓ of the initial brightness. In the evaluation system, the degree of vacuum was $1\times10^{-6}$ Pa and the accelerating voltage was 15 kV. As a comparative sample (1), a diamond electron emission cathode was prepared by shaping a single crystal p-type semiconductor diamond which was identical to that synthesized by vapor phase growth and used for samples with numbers (1) to (23) into the same shape as the samples with numbers (1) to (23) [except (17), (18)], and evaluated. As a comparative sample (2), a diamond electron emission cathode which was identical to the sample number (1), except that the concentration of both the n-type impurities and the p-type impurities was less than $2.0\times10^{15}$ cm$^{-3}$ was prepared and evaluated. $LaB_6$ was also evaluated as a comparative example. The evaluation results of the samples are shown in Table 1.

In the samples composed of a p-type semiconductor with a concentration of p-type impurities of $2\times10^{15}$ cm$^{-3}$ or higher and n-type semiconductor with a concentration of n-type impurities of $2\times10^{15}$ cm$^{-3}$ or higher, at least three properties from among the beam energy width, emission current, initial brightness, and service life were superior to those of LaB$_6$. Furthermore, these samples were superior to comparative samples (1) and (2) with respect to all the aforementioned properties.

Diamond electron emission cathodes identical to samples with numbers (1) to (23), except that a single crystal p-type semiconductor diamond synthesized by high-temperature and high-pressure process was used as the second semiconductor, were fabricated and evaluated. The initial brightness in all such samples became 95 to 98%.

The diamond electron emission cathodes of samples with numbers (1) to (23) were evaluated in the same manner as described above after changing the material of support terminals to SUS304 with a melting point of not higher than 1700 K, but the results obtained were identical to those obtained by using Mo. Furthermore, diamond electron emission sources equipped with the diamond electron emission cathodes of samples with numbers (1) to (23) were mounted on an electron microscope and used for observing objects of fine structures. The observations could be conducted at a magnification ratio higher than that attained with LaB$_6$. Furthermore, the diamond electron emission sources were mounted on electron beam exposure devices and electron beam exposure was performed. Fine patterns could be drawn with a higher throughput than with LaB$_6$.

TABLE 1-1

| | (1) | (2) | (3) | (4) | (5) | (6) | (7) | (8) | (9) |
|---|---|---|---|---|---|---|---|---|---|
| Structure | pn | pn | pin | pn | pn | pn | pin | pn | pn |
| Semiconductor of electron emitting portion | n | p | i | n | n | p | i | n | n |
| (III) Plane of sharpened acute section | no | no | no | yes | no | no | no | yes | no |
| H termination of electron emitting portion | no | no | no | no | yes | yes | yes | yes | no |
| n-Type impurity (P) concentration (cm$^{-3}$) | $7.0\times10^{18}$ | $7.0\times10^{18}$ | $7.0\times10^{18}$ | $2.0\times10^{19}$ | $7.0\times10^{18}$ | $7.0\times10^{18}$ | $7.0\times10^{18}$ | $2.0\times10^{19}$ | $6.0\times10^{19}$ |
| p-Type impurity (B) concentration (cm$^{-3}$) | $4.0\times10^{19}$ | $4.0\times10^{19}$ | $4.0\times10^{19}$ | $4.0\times10^{19}$ | $4.0\times10^{19}$ | $4.0\times10^{19}$ | $4.0\times10^{19}$ | $4.0\times10^{19}$ | $4.0\times10^{19}$ |
| i-Type carrier concentration @300 K (cm$^{-3}$) | — | — | $<10^{9}$ | — | — | — | $<10^{9}$ | — | — |
| n-Type specific resistance @300 K ($\Omega$cm) | $3.0\times10^{4}$ | $3.0\times10^{4}$ | $3.0\times10^{4}$ | $3.0\times10^{3}$ | $3.0\times10^{4}$ | $3.0\times10^{4}$ | $3.0\times10^{4}$ | $3.0\times10^{3}$ | $3.0\times10^{2}$ |
| Curvature radius of tip end (μm) | 10 | 10 | 10 | 10 | 10 | 10 | 10 | 10 | 10 |
| Evaluation temperature (K) | 650 | 650 | 650 | 650 | 650 | 650 | 650 | 650 | 650 |
| Resistance between terminals (without metal layer) ($\Omega$) | 1000 | 1000 | 2500 | 500 | 1000 | 1000 | 2500 | 500 | 500 |
| Energy width (eV) | 0.5 | 0.5 | 0.4 | 0.5 | 0.5 | 0.5 | 0.4 | 0.5 | 0.5 |
| Emission current (μA) | 90 | 100 | 110 | 93 | 105 | 120 | 130 | 110 | 95 |
| Initial brightness (A/cm$^2$ sr) | $4.3\times10^{6}$ | $4.8\times10^{6}$ | $5.3\times10^{6}$ | $4.5\times10^{6}$ | $5.0\times10^{6}$ | $5.8\times10^{6}$ | $6.2\times10^{6}$ | $5.3\times10^{6}$ | $4.6\times10^{6}$ |
| Service life (hr) | 14000 | 13000 | 13000 | 14000 | 13000 | 13000 | 13000 | 13000 | 13500 |
| Resistance between terminals (with metal layer) ($\Omega$) | 100 | 100 | 500 | 50 | 100 | 100 | 500 | 50 | 50 |
| Energy width (eV) | 0.5 | 0.5 | 0.4 | 0.5 | 0.5 | 0.5 | 0.4 | 0.5 | 0.5 |
| Emission current (μA) | 120 | 130 | 140 | 122 | 135 | 150 | 155 | 140 | 125 |
| Initial brightness (A/cm$^2$ sr) | $5.8\times10^{6}$ | $6.2\times10^{6}$ | $6.7\times10^{6}$ | $5.9\times10^{6}$ | $6.5\times10^{6}$ | $7.2\times10^{6}$ | $7.4\times10^{6}$ | $6.7\times10^{6}$ | $6.0\times10^{6}$ |
| Service life (hr) | 13000 | 12000 | 12000 | 13000 | 12000 | 11000 | 11000 | 12000 | 12500 |
| Resistance between terminals (metal coating) ($\Omega$) | 50 | 50 | 250 | 20 | 50 | 50 | 250 | 20 | 20 |
| Energy width (eV) | 0.5 | 0.5 | 0.4 | 0.5 | 0.5 | 0.5 | 0.4 | 0.5 | 0.5 |
| Emission current (μA) | 140 | 150 | 160 | 145 | 155 | 180 | 190 | 170 | 145 |
| Initial brightness (A/cm$^2$ sr) | $6.7\times10^{6}$ | $7.2\times10^{6}$ | $7.7\times10^{6}$ | $7.0\times10^{6}$ | $7.4\times10^{6}$ | $8.6\times10^{6}$ | $9.1\times10^{6}$ | $8.2\times10^{6}$ | $7.0\times10^{6}$ |
| Service life (hr) | 12000 | 11000 | 11000 | 12000 | 11000 | 10000 | 10000 | 11000 | 11500 |

| | (10) | (11) | (12) | (13) | (14) | (15) | (16) | Comp. (1) | LaB$_6$ |
|---|---|---|---|---|---|---|---|---|---|
| Structure | pn | pin | pn | pn | pn | pin | pn | p | — |
| Semiconductor of electron emitting portion | p | i | n | n | p | i | n | p | — |
| (III) Plane of sharpened acute section | no | no | yes | no | no | no | yes | no | — |
| H termination of electron emitting portion | no | no | no | yes | yes | yes | yes | no | — |
| n-Type impurity (P) concentration (cm$^{-3}$) | $6.0\times10^{19}$ | $6.0\times10^{19}$ | $1.2\times10^{20}$ | $6.0\times10^{19}$ | $6.0\times10^{19}$ | $6.0\times10^{19}$ | $1.2\times10^{20}$ | — | — |
| p-Type impurity (B) concentration (cm$^{-3}$) | $4.0\times10^{19}$ | $4.0\times10^{19}$ | $4.0\times10^{19}$ | $4.0\times10^{19}$ | $4.0\times10^{19}$ | $4.0\times10^{19}$ | $4.0\times10^{19}$ | $4.0\times10^{19}$ | — |
| i-Type carrier concentration @300 K (cm$^{-3}$) | — | $<10^{9}$ | — | — | — | $<10^{9}$ | — | — | — |
| n-Type specific resistance @300 K ($\Omega$cm) | $3.0\times10^{2}$ | $3.0\times10^{2}$ | $1.0\times10^{2}$ | $3.0\times10^{2}$ | $3.0\times10^{2}$ | $3.0\times10^{2}$ | $1.0\times10^{2}$ | — | — |
| Curvature radius of tip end (μm) | 10 | 10 | 10 | 10 | 10 | 10 | 10 | 10 | 10 |
| Evaluation temperature (K) | 650 | 650 | 650 | 650 | 650 | 650 | 650 | 650 | 1800 |
| Resistance between terminals (without metal layer) ($\Omega$) | 500 | 1500 | 250 | 500 | 500 | 1500 | 250 | 200 | 2 |
| Energy width (eV) | 0.5 | 0.4 | 0.5 | 0.5 | 0.5 | 0.4 | 0.5 | 0.5 | 1 |
| Emission current (μA) | 110 | 120 | 100 | 135 | 140 | 150 | 145 | 1 | 75 |
| Initial brightness (A/cm$^2$ sr) | $5.3\times10^{6}$ | $5.8\times10^{6}$ | $4.8\times10^{6}$ | $6.5\times10^{6}$ | $6.7\times10^{6}$ | $7.2\times10^{6}$ | $7.0\times10^{6}$ | $4.8\times10^{4}$ | $7.0\times10^{5}$ |
| Service life (hr) | 13000 | 13000 | 13000 | 12000 | 12000 | 11000 | 11500 | — | 3000 |

TABLE 1-1-continued

|  |  |  |  |  |  |  |  |  |  |
|---|---|---|---|---|---|---|---|---|---|
| Resistance between terminals (with metal layer) (Ω) | 50 | 250 | 20 | 50 | 50 | 250 | 20 | 15 | — |
| Energy width (eV) | 0.5 | 0.4 | 0.5 | 0.5 | 0.5 | 0.4 | 0.5 | 0.5 | — |
| Emission current (μA) | 140 | 150 | 130 | 155 | 160 | 170 | 165 | 1 | — |
| Initial brightness (A/cm² sr) | $6.7 \times 10^6$ | $7.2 \times 10^6$ | $6.2 \times 10^6$ | $7.4 \times 10^6$ | $7.7 \times 10^6$ | $8.2 \times 10^6$ | $7.9 \times 10^6$ | $4.8 \times 10^4$ | — |
| Service life (hr) | 12000 | 11500 | 12000 | 11000 | 11000 | 11000 | 10000 | — | — |
| Resistance between terminals (metal coating) (Ω) | 20 | 120 | 10 | 20 | 20 | 120 | 10 | 5 | — |
| Energy width (eV) | 0.5 | 0.4 | 0.5 | 0.6 | 0.5 | 0.4 | 0.5 | 0.5 | — |
| Emission current (μA) | 170 | 180 | 150 | 185 | 190 | 200 | 195 | 1 | — |
| Initial brightness (A/cm² sr) | $8.2 \times 10^6$ | $8.6 \times 10^6$ | $7.2 \times 10^6$ | $8.9 \times 10^6$ | $9.1 \times 10^6$ | $9.6 \times 10^6$ | $9.4 \times 10^6$ | $4.8 \times 10^4$ | — |
| Service life (hr) | 11000 | 10000 | 11000 | 10000 | 10000 | 10000 | 10000 | — | — |

TABLE 1-2

| | Sample number | | | | | | | |
|---|---|---|---|---|---|---|---|---|
| | (17) | (18) | (19) | (29) | (21) | (22) | (23) | Comp. (2) |
| Structure | pn | pn | pn | pn | pn | pn | pn | pn |
| Semiconductor of electron emitting portion | n | n | n | n | n | n | n | n |
| (III) Plane of sharpened acute section | no | no | no | no | no | no | no | no |
| H termination of electron emitting portion | no | no | no | no | no | no | no | no |
| n-Type impurity (P) concentration (cm⁻³) | $7.0 \times 10^{18}$ | $7.0 \times 10^{18}$ | $7.0 \times 10^{18}$ | $7.0 \times 10^{18}$ | $7.0 \times 10^{18}$ | $7.0 \times 10^{18}$ | $2.0 \times 10^{15}$ | $<2.0 \times 10^{15}$ |
| p-Type impurity (B) concentration (cm⁻³) | $4.0 \times 10^{19}$ | $4.0 \times 10^{19}$ | $4.0 \times 10^{19}$ | $4.0 \times 10^{19}$ | $4.0 \times 10^{19}$ | $4.0 \times 10^{19}$ | $2.0 \times 10^{15}$ | $<2.0 \times 10^{15}$ |
| i-Type carrier concentration @300 K (cm⁻³) | — | — | — | — | — | — | — | — |
| n-Type specific resistance @300 K (Ωcm) | $3.0 \times 10^4$ | $3.0 \times 10^4$ | $3.0 \times 10^4$ | $3.0 \times 10^4$ | $3.0 \times 10^4$ | $3.0 \times 10^4$ | $2.0 \times 10^6$ | $2.0 \times 10^6$ |
| Curvature radius of tip end (μm) | 30 | 40 | 10 | 10 | 10 | 10 | 10 | 10 |
| Evaluation temperature (K) | 650 | 650 | 400 | 300 | 1200 | 1300 | 1200 | 1200 |
| Resistance between terminals (without metal layer) (Ω) | 1000 | 1000 | 1000 | 1000 | 100 | 100 | 1000 | 5000 |
| Energy width (eV) | 0.5 | 0.6 | 0.4 | 0.4 | 0.6 | 0.6 | 0.6 | — |
| Emission current (μA) | 100 | 120 | 80 | 50 | 300 | 320 | 80 | 0 |
| Initial brightness (A/cm² sr) | $1.5 \times 10^6$ | $5.0 \times 10^5$ | $3.8 \times 10^6$ | $2.4 \times 10^6$ | $1.4 \times 10^7$ | $1.5 \times 10^7$ | $3.8 \times 10^6$ | 0 |
| Service life (hr) | 15000 | 16000 | 15000 | 18000 | 3500 | 2500 | 4000 | — |
| Resistance between terminals (with metal layer) (Ω) | 100 | 100 | 100 | 100 | 100 | 100 | 500 | 500 |
| Energy width (eV) | 0.5 | 0.6 | 0.4 | 0.4 | 0.6 | 0.6 | 0.6 | — |
| Emission current (μA) | 110 | 130 | 90 | 60 | 300 | 320 | 85 | 0 |
| Initial brightness (A/cm² sr) | $1.7 \times 10^6$ | $5.4 \times 10^5$ | $4.3 \times 10^6$ | $2.9 \times 10^6$ | $1.4 \times 10^7$ | $1.5 \times 10^7$ | $4.0 \times 10^6$ | 0 |
| Service life (hr) | 14000 | 15000 | 14000 | 17000 | 3500 | 2500 | 3500 | — |
| Resistance between terminals (metal coating) (Ω) | 50 | 50 | 50 | 50 | 100 | 100 | 300 | 300 |
| Energy width (eV) | 0.5 | 0.6 | 0.4 | 0.4 | 0.6 | 0.6 | 0.6 | — |
| Emission current (μA) | 120 | 140 | 100 | 70 | 300 | 320 | 90 | 0 |
| Initial brightness (A/cm² sr) | $1.8 \times 10^6$ | $5.8 \times 10^5$ | $4.8 \times 10^6$ | $3.4 \times 10^6$ | $1.4 \times 10^7$ | $1.5 \times 10^7$ | $4.3 \times 10^6$ | 0 |
| Service life (hr) | 13000 | 14000 | 13000 | 16000 | 3500 | 2500 | 3500 | — |

Example 2

The samples with numbers (24) to (46) were fabricated as diamond electron emission cathodes. All the samples had a size of 0.6 mm×0.6 mm×2.5 mmt and an aspect ratio of about 4.2. A single crystal p-type semiconductor diamond synthesized by vapor phase growth was prepared as the second semiconductor and shaped by laser machining and polishing. Then, the second semiconductor was used as a substrate and an n-type semiconductor diamond that is the first semiconductor, or an intrinsic semiconductor diamond that is the third semiconductor was epitaxially grown thereupon by vapor phase growth. The p-type impurity of the p-type semiconductor diamond was B. Single crystals with a B concentration of $4 \times 10^{19}$ cm⁻³ were used for all the samples. The samples with numbers (24), (27), (28), (31), (32), (35), (36), (39), (40) to (46) were used to fabricate diamond electron emission cathodes such as the cathode shown in FIG. 1, the samples with numbers (25), (29), (33), (37) were used to fabricate diamond electron emission cathodes such as the cathode shown in FIG. 4, and the samples with numbers (26), (30), (34), (38) were used to fabricate diamond electron emission cathodes such as the cathode shown in FIG. 7. The epitaxial growth was conducted so that the concentration of carriers in the intrinsic semiconductor diamond at 300 K was $1 \times 10^9$ cm⁻³ or less. The n-type impurity of the n-type semiconductor diamond was P. For the samples with numbers (24) to (31), (40) to (46), the n-type semiconductor diamonds were synthesized under the same conditions, and in the samples with numbers (27) and (31) in which the (111) crystal plane was the plane at the electron emitting portion as an apex, P was doped to a high concentration and a low specific resistance was obtained at 300 K. For the samples with numbers (32) to (39), the n-type semiconductor diamonds were synthesized under the another same conditions, and in samples with numbers (35) and (39) in which the (111) crystal plane was the plane at the electron emitting portion as an apex, P was doped to a high concentration and a low specific resistance was obtained at 300 K. Then, a protruding structure such as shown in FIG. 12 was formed by subjecting the electron emitting portion of the samples with numbers (24) to (46) to FIB processing. The protruding structure with a tip end diameter of 1 μm, a height of 3 μm, and an aspect ratio of 3 was formed for all the sample, except the samples with numbers (40), (41). The sample number (40) had protruding structure with a tip end diameter of 5 μm, and the sample number (41) had protruding structure with a tip end diameter of 7 μm.

In the samples with numbers (28) to (31), (36) to (39), the electron emitting portions were terminated with hydrogen by treating the samples with hydrogen plasma. All the fabricated diamond electron emission cathodes were used in diamond electron emission sources having Mo support terminals (current introducing terminals) such as shown in FIG. 15, and the electron emission characteristic and electron beam characteristic were initially evaluated without a metal layer. Then, a metal layer was formed by Mo, as shown in FIG. 13, on the diamond electron emission cathodes and the cathodes were evaluated in the diamond electron emission sources with Mo support terminals such as shown in FIG. 16. The diamond electron emission cathodes were then provided with a metal coating as far as the distance of 300 μm from the tip end of the electron emitting portion by using Mo, as shown in FIG. 14, and the cathodes were evaluated in the diamond electron emission sources with Mo support terminals such as shown in FIG. 16. For the evaluation, the diamond electron emission cathodes were clamped with the support terminals as shown in FIG. 3, FIG. 6, and FIG. 9. In the evaluation, the resistance between the terminals for the diamond electron emission cathode at the evaluation temperature was measured and then the beam energy width, emission current value, initial brightness, and service life were measured. The service life was taken as an interval in which the brightness decreased to ⅓ of the initial brightness. In the evaluation system, the degree of vacuum was $1 \times 10^{-7}$ Pa, the extracting voltage was 3 kV, and the accelerating voltage was 15 kV. As a comparative sample (3), a diamond electron emission cathode was prepared by shaping a single crystal p-type semiconductor diamond which was identical to that synthesized by vapor phase growth and used for samples with numbers (24) to (46) into the same shape as the samples with numbers (24) to (46) [except (40), (41)], and evaluated. As a comparative sample (4), a diamond electron emission cathode which was identical to the sample number (24), except that the concentration of both the n-type impurities and the p-type impurities was less than $2.0 \times 10^{15}$ cm$^{-3}$ was prepared, and evaluated. ZrO/W was also evaluated as a comparative example. The evaluation results of the samples are shown in Table 2.

In the samples composed of a p-type semiconductor with a concentration of p-type impurities of $2 \times 10^{15}$ cm$^{-3}$ or higher and n-type semiconductor with a concentration of n-type impurities of $2 \times 10^{15}$ cm$^{-3}$ or higher, at least three properties from among the beam energy width, emission current, initial brightness, and service life were superior to those of ZrO/W. Furthermore, these samples were superior to comparative samples (3) and (4) with respect to all the aforementioned properties.

Diamond electron emission cathodes identical to samples with numbers (24) to (46), except that a single crystal p-type semiconductor diamond synthesized by high-temperature and high-pressure process was used as the second semiconductor, were fabricated and evaluated. The initial brightness in all such samples became 95 to 98%.

The diamond electron emission cathodes of samples with numbers (24) to (46) were evaluated in the same manner as described above after changing the material of support terminals to SUS304 with a melting point of not higher than 1700 K, but the results obtained were identical to those obtained by using Mo. Furthermore, electron emission sources equipped with the diamond electron emission cathodes of samples with numbers (24) to (46) were mounted on an electron microscope and used for observing objects of fine structures. The observations could be conducted at a magnification ratio higher than that attained with ZrO/W. Furthermore, the diamond electron emission sources were mounted on electron beam exposure devices and electron beam exposure was performed. Fine patterns could be drawn with a higher throughput than with LaB$_6$.

TABLE 2-1

| | Sample number | | | | | | | | |
|---|---|---|---|---|---|---|---|---|---|
| | (24) | (25) | (26) | (27) | (28) | (29) | (30) | (31) | (32) |
| Structure | pn | pn | pin | pn | pn | pn | pin | pn | pn |
| Semiconductor of electron emitting portion | n | p | i | n | n | p | i | n | n |
| (III) Plane of sharpened acute section | no | no | no | yes | no | no | no | yes | no |
| H termination of electron emitting portion | no | no | no | no | yes | yes | yes | yes | no |
| n-Type impurity (P) concentration (cm$^{-3}$) | $7.0 \times 10^{18}$ | $7.0 \times 10^{18}$ | $7.0 \times 10^{18}$ | $2.0 \times 10^{19}$ | $7.0 \times 10^{18}$ | $7.0 \times 10^{18}$ | $7.0 \times 10^{18}$ | $2.0 \times 10^{19}$ | $6.0 \times 10^{19}$ |
| p-Type impurity (B) concentration (cm$^{-3}$) | $4.0 \times 10^{19}$ | $4.0 \times 10^{19}$ | $4.0 \times 10^{19}$ | $4.0 \times 10^{19}$ | $4.0 \times 10^{19}$ | $4.0 \times 10^{19}$ | $4.0 \times 10^{19}$ | $4.0 \times 10^{19}$ | $4.0 \times 10^{19}$ |
| i-Type carrier concentration @300 K (cm$^{-3}$) | — | — | <10$^9$ | — | — | — | <10$^9$ | — | — |
| n-Type specific resistance @300 K (Ωcm) | $3.0 \times 10^4$ | $3.0 \times 10^4$ | $3.0 \times 10^4$ | $3.0 \times 10^3$ | $3.0 \times 10^4$ | $3.0 \times 10^4$ | $3.0 \times 10^4$ | $3.0 \times 10^3$ | $3.0 \times 10^2$ |
| Tip end diameter (μm) | 1 | 1 | 1 | 1 | 1 | 1 | 1 | 1 | 1 |
| Evaluation temperature (K) | 650 | 650 | 650 | 650 | 650 | 650 | 650 | 650 | 650 |
| Resistance between terminals (without metal layer) (Ω) | 1000 | 1000 | 2500 | 500 | 1000 | 1000 | 2500 | 500 | 500 |
| Energy width (eV) | 0.2 | 0.2 | 0.1 | 0.2 | 0.2 | 0.2 | 0.1 | 0.2 | 0.2 |
| Emission current (μA) | 250 | 270 | 280 | 255 | 275 | 290 | 300 | 280 | 260 |
| Initial brightness (A/cm$^2$ sr) | $1.3 \times 10^8$ | $1.4 \times 10^8$ | $1.5 \times 10^8$ | $1.3 \times 10^8$ | $1.4 \times 10^8$ | $1.5 \times 10^8$ | $1.6 \times 10^8$ | $1.5 \times 10^8$ | $1.4 \times 10^8$ |
| Service life (hr) | 12000 | 11000 | 11000 | 12000 | 11000 | 11000 | 10000 | 11000 | 12000 |
| Resistance between terminals (with metal layer) (Ω) | 100 | 100 | 500 | 50 | 100 | 100 | 500 | 50 | 50 |
| Energy width (eV) | 0.2 | 0.2 | 0.1 | 0.2 | 0.2 | 0.2 | 0.1 | 0.2 | 0.2 |

TABLE 2-1-continued

| | | | | | | | | | |
|---|---|---|---|---|---|---|---|---|---|
| Emission current (μA) | 280 | 290 | 300 | 285 | 295 | 310 | 320 | 300 | 285 |
| Initial brightness (A/cm$^2$ sr) | $1.5 \times 10^8$ | $1.5 \times 10^8$ | $1.6 \times 10^8$ | $1.5 \times 10^8$ | $1.5 \times 10^8$ | $1.6 \times 10^8$ | $1.7 \times 10^8$ | $1.6 \times 10^8$ | $1.5 \times 10^8$ |
| Service life (hr) | 11000 | 11000 | 10000 | 11000 | 11000 | 10000 | 10000 | 10000 | 11000 |
| Resistance between terminals (metal coating) (Ω) | 50 | 50 | 250 | 20 | 50 | 50 | 250 | 20 | 20 |
| Energy width (eV) | 0.2 | 0.2 | 0.1 | 0.2 | 0.2 | 0.2 | 0.1 | 0.2 | 0.2 |
| Emission current (μA) | 300 | 310 | 320 | 305 | 320 | 345 | 355 | 330 | 305 |
| Initial brightness (A/cm$^2$ sr) | $1.6 \times 10^8$ | $1.6 \times 10^8$ | $1.7 \times 10^8$ | $1.6 \times 10^8$ | $1.7 \times 10^8$ | $1.8 \times 10^8$ | $1.8 \times 10^8$ | $1.7 \times 10^8$ | $1.6 \times 10^8$ |
| Service life (hr) | 10000 | 10000 | 10000 | 10000 | 10000 | 10000 | 10000 | 10000 | 10000 |

| | Sample number | | | | | | | | |
|---|---|---|---|---|---|---|---|---|---|
| | (33) | (34) | (35) | (36) | (37) | (38) | (39) | Comp. (3) | Zr/W |
| Structure | pn | pin | pn | pn | pn | pin | pn | p | — |
| Semiconductor of electron emitting portion | p | i | n | n | p | i | n | p | — |
| (III) Plane of sharpened acute section | no | no | yes | no | no | no | yes | no | — |
| H termination of electron emitting portion | no | no | no | yes | yes | yes | yes | no | — |
| n-Type impurity (P) concentration (cm$^{-3}$) | $6.0 \times 10^{19}$ | $6.0 \times 10^{19}$ | $1.2 \times 10^{20}$ | $6.0 \times 10^{19}$ | $6.0 \times 10^{19}$ | $6.0 \times 10^{19}$ | $1.2 \times 10^{20}$ | — | — |
| p-Type impurity (B) concentration (cm$^{-3}$) | $4.0 \times 10^{19}$ | $4.0 \times 10^{19}$ | $4.0 \times 10^{19}$ | $4.0 \times 10^{19}$ | $4.0 \times 10^{19}$ | $4.0 \times 10^{19}$ | $4.0 \times 10^{19}$ | $4.0 \times 10^{19}$ | — |
| i-Type carrier concentration @300 K (cm$^{-3}$) | — | $<10^9$ | — | — | — | $<10^9$ | — | — | — |
| n-Type specific resistance @300 K (Ωcm) | $3.0 \times 10^2$ | $3.0 \times 10^2$ | $1.0 \times 10^2$ | $3.0 \times 10^2$ | $3.0 \times 10^2$ | $3.0 \times 10^2$ | $1.0 \times 10^2$ | — | — |
| Tip end diameter (μm) | 1 | 1 | 1 | 1 | 1 | 1 | 1 | 1 | 1 |
| Evaluation temperature (K) | 650 | 650 | 650 | 650 | 650 | 650 | 650 | 650 | 1800 |
| Resistance between terminals (without metal layer) (Ω) | 500 | 1500 | 250 | 500 | 500 | 1500 | 250 | 200 | 1 |
| Energy width (eV) | 0.2 | 0.1 | 0.2 | 0.2 | 0.2 | 0.1 | 0.2 | 0.2 | 0.5 |
| Emission current (μA) | 280 | 290 | 270 | 295 | 300 | 315 | 310 | 1 | 150 |
| Initial brightness (A/cm$^2$ sr) | $1.5 \times 10^8$ | $1.5 \times 10^8$ | $1.4 \times 10^8$ | $1.5 \times 10^8$ | $1.6 \times 10^8$ | $1.6 \times 10^8$ | $1.6 \times 10^8$ | $5.0 \times 10^5$ | $4.1 \times 10^7$ |
| Service life (hr) | 11000 | 11000 | 11000 | 11000 | 10000 | 10000 | 10000 | — | 6000 |
| Resistance between terminals (with metal layer) (Ω) | 50 | 250 | 20 | 50 | 50 | 250 | 20 | 10 | — |
| Energy width (eV) | 0.2 | 0.1 | 0.2 | 0.2 | 0.2 | 0.1 | 0.2 | 0.2 | — |
| Emission current (μA) | 300 | 310 | 290 | 320 | 325 | 340 | 330 | 1 | — |
| Initial brightness (A/cm$^2$ sr) | $1.6 \times 10^8$ | $1.6 \times 10^8$ | $1.5 \times 10^8$ | $1.7 \times 10^8$ | $1.7 \times 10^8$ | $1.8 \times 10^8$ | $1.7 \times 10^8$ | $5.0 \times 10^5$ | — |
| Service life (hr) | 10000 | 10000 | 11000 | 10000 | 10000 | 10000 | 10000 | — | — |
| Resistance between terminals (metal coating) (Ω) | 20 | 120 | 10 | 20 | 20 | 120 | 10 | 5 | — |
| Energy width (eV) | 0.2 | 0.1 | 0.2 | 0.2 | 0.2 | 0.1 | 0.2 | 0.2 | — |
| Emission current (μA) | 330 | 345 | 310 | 350 | 355 | 370 | 360 | 1 | — |
| Initial brightness (A/cm$^2$ sr) | $1.7 \times 10^8$ | $1.8 \times 10^8$ | $1.6 \times 10^8$ | $1.8 \times 10^8$ | $1.8 \times 10^8$ | $1.9 \times 10^8$ | $1.9 \times 10^8$ | $5.0 \times 10^5$ | — |
| Service life (hr) | 10000 | 10000 | 10000 | 10000 | 10000 | 10000 | 10000 | — | — |

TABLE 2-2

| | Sample number | | | | | | | |
|---|---|---|---|---|---|---|---|---|
| | (40) | (41) | (42) | (43) | (44) | (45) | (46) | Comp. (4) |
| Structure | pn | pn | pn | pn | pn | pn | pn | pn |
| Semiconductor of electron emitting portion | n | n | n | n | n | n | n | n |
| (III) Plane of sharpened acute section | no | no | no | no | no | no | no | no |
| H termination of electron emitting portion | no | no | no | no | no | no | no | no |
| n-Type impurity (P) concentration (cm$^{-3}$) | $7.0 \times 10^{18}$ | $7.0 \times 10^{18}$ | $7.0 \times 10^{18}$ | $7.0 \times 10^{18}$ | $7.0 \times 10^{18}$ | $7.0 \times 10^{18}$ | $2.0 \times 10^{15}$ | $<2.0 \times 10^{15}$ |
| p-Type impurity (B) concentration (cm$^{-3}$) | $4.0 \times 10^{19}$ | $4.0 \times 10^{19}$ | $4.0 \times 10^{19}$ | $4.0 \times 10^{19}$ | $4.0 \times 10^{19}$ | $4.0 \times 10^{19}$ | $2.0 \times 10^{15}$ | $<2.0 \times 10^{15}$ |
| i-Type carrier concentration @300 K (cm$^{-3}$) | — | — | — | — | — | — | — | — |
| n-Type specific resistance @300 K (Ωcm) | $3.0 \times 10^4$ | $3.0 \times 10^4$ | $3.0 \times 10^4$ | $3.0 \times 10^4$ | $3.0 \times 10^4$ | $3.0 \times 10^4$ | $2.0 \times 10^6$ | $2.0 \times 10^6$ |
| Tip end diameter (μm) | 5 | 7 | 1 | 1 | 1 | 1 | 1 | 1 |
| Evaluation temperature (K) | 650 | 650 | 400 | 300 | 1200 | 1300 | 1200 | 1200 |
| Resistance between terminals (without metal layer) (Ω) | 1000 | 1000 | 1000 | 1000 | 100 | 100 | 1000 | 5000 |
| Energy width (eV) | 0.3 | 0.3 | 0.2 | 0.2 | 0.4 | 0.4 | 0.4 | — |
| Emission current (μA) | 230 | 200 | 190 | 130 | 500 | 510 | 230 | 0 |
| Initial brightness (A/cm$^2$ sr) | $7.8 \times 10^7$ | $2.3 \times 10^7$ | $9.9 \times 10^7$ | $6.8 \times 10^7$ | $2.6 \times 10^8$ | $2.9 \times 10^8$ | $1.2 \times 10^8$ | 0 |
| Service life (hr) | 13000 | 14000 | 13000 | 14000 | 6500 | 4500 | 7000 | — |
| Resistance between terminals (with metal layer) (Ω) | 100 | 100 | 100 | 100 | 100 | 100 | 500 | 500 |

TABLE 2-2-continued

| | Sample number | | | | | | | |
|---|---|---|---|---|---|---|---|---|
| | (40) | (41) | (42) | (43) | (44) | (45) | (46) | Comp. (4) |
| Energy width (eV) | 0.3 | 0.3 | 0.2 | 0.2 | 0.4 | 0.4 | 0.4 | — |
| Emission current (µA) | 240 | 210 | 200 | 140 | 500 | 510 | 235 | 0 |
| Initial brightness (A/cm$^2$ sr) | $8.1 \times 10^7$ | $2.4 \times 10^7$ | $1.0 \times 10^8$ | $7.3 \times 10^7$ | $2.6 \times 10^8$ | $2.9 \times 10^8$ | $1.2 \times 10^8$ | 0 |
| Service life (hr) | 12000 | 13000 | 13000 | 14000 | 6500 | 4500 | 7000 | — |
| Resistance between terminals (metal coating) (Ω) | 50 | 50 | 50 | 50 | 100 | 100 | 300 | 300 |
| Energy width (eV) | 0.3 | 0.3 | 0.2 | 0.2 | 0.4 | 0.4 | 0.4 | — |
| Emission current (µA) | 250 | 220 | 210 | 145 | 500 | 510 | 240 | 0 |
| Initial brightness (A/cm$^2$ sr) | $8.5 \times 10^7$ | $2.5 \times 10^7$ | $1.1 \times 10^8$ | $7.6 \times 10^7$ | $2.6 \times 10^8$ | $2.9 \times 10^8$ | $1.2 \times 10^8$ | 0 |
| Service life (hr) | 11000 | 12000 | 13000 | 14000 | 6500 | 4500 | 7000 | — |

As follows from the above-described examples; the diamond electron emission cathode and electron emission source in accordance with the present invention have a high brightness and a narrow energy width and, therefore, can be advantageously used in electron ray and electron beam devices such as electron microscopes and electron beam exposure devices and vacuum tubes such as traveling wave tubes and microwave tubes. Furthermore, electron microscopes using such diamond electron emission cathode and electron emission source in accordance with the present invention enable high magnification observations, and the electron beam exposure devices allow fine patterns to be drawn with a high throughput. It goes without saying, that the diamond electron emission cathode and electron emission source in accordance with the present invention are suitable for devices of all types using electron beams, such as electron beam analyzers, accelerators, electron beam irradiation devices for sterilization, X-ray generators, irradiation devices for resins, and electron beam heating devices.

BRIEF DESCRIPTION OF THE DRAWINGS

FIG. 2(a) is a plan view, (b) is a front view, and (c) is a right side view;

FIG. 5(a) is a plan view, (b) is a front view, and (c) is a right side view;

FIG. 8(a) is a plan view, (b) is a front view, and (c) is a right side view;

FIG. 10 is a three-plane view illustrating an example of the shape of the electron emitting portion;

EXPLANATION OF REFERENCE SYMBOLS

Figure 1:
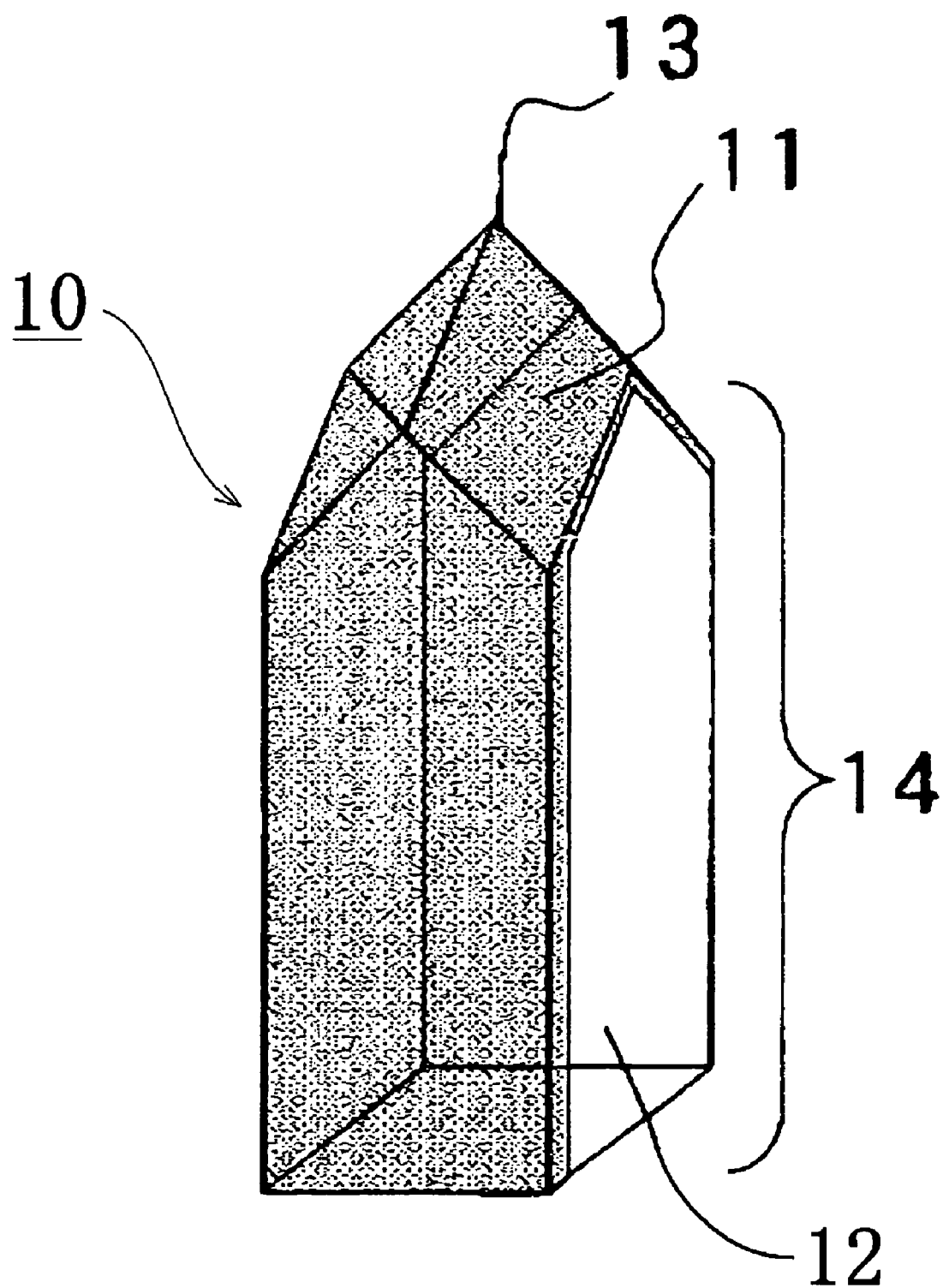
FIG. 1 is a perspective view illustrating an example of the diamond electron emission cathode in accordance with the present invention.
Figure 2:
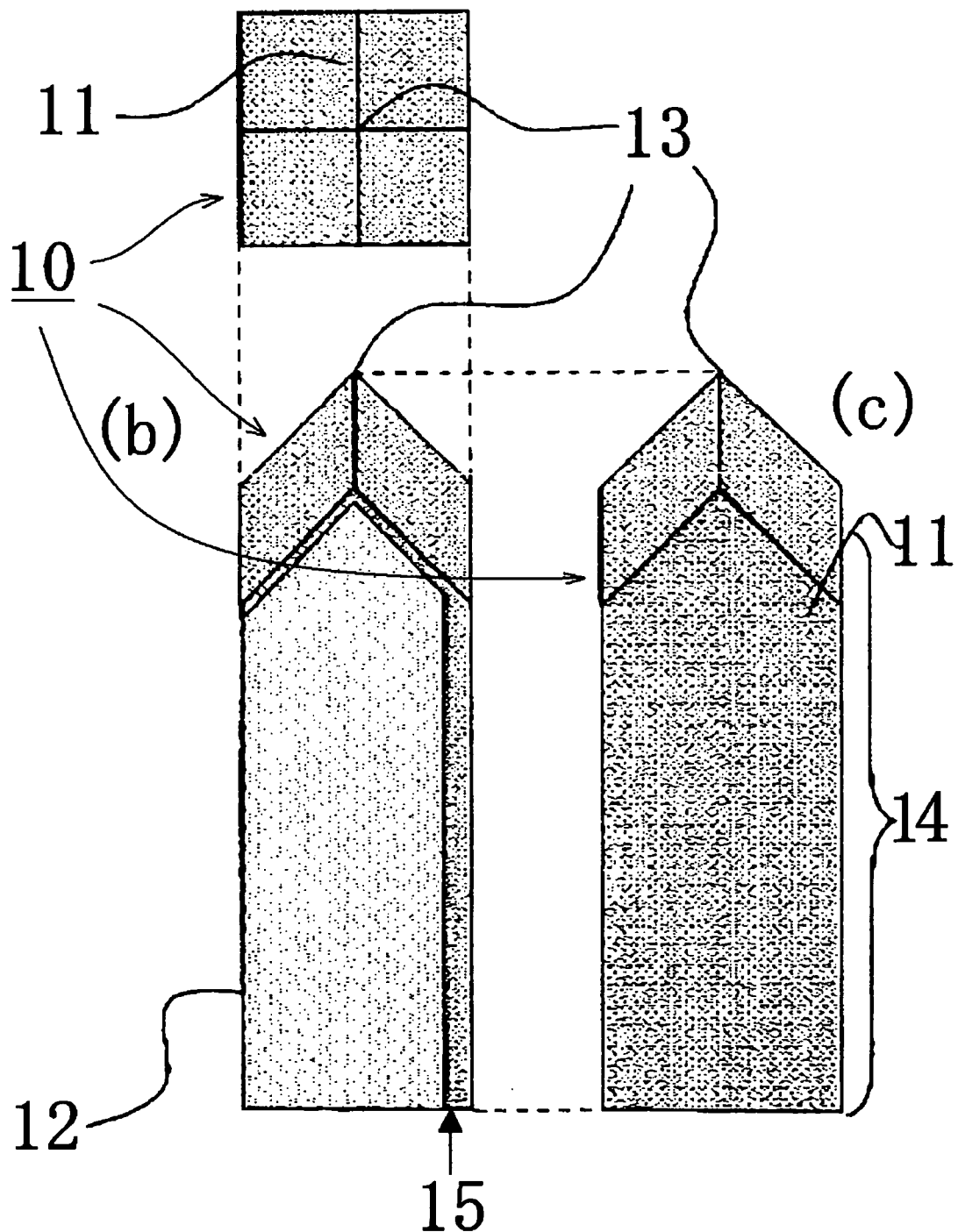
FIG. 2 is a three-plane view of the diamond electron emission cathode shown in FIG. 1.
Figure 3:
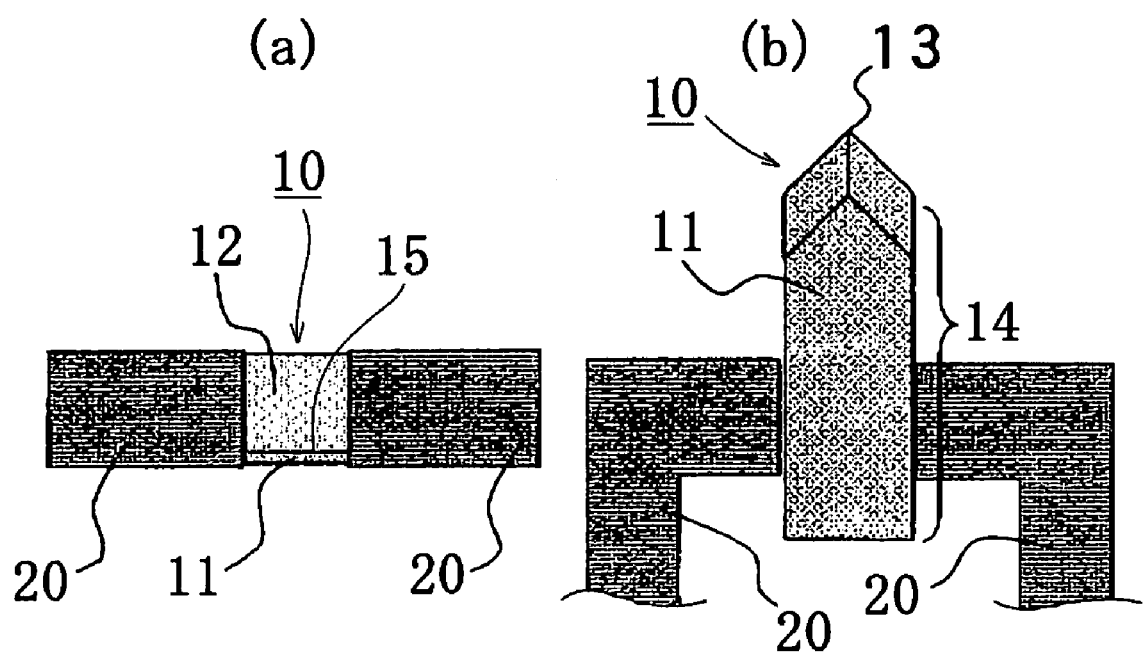
FIG. 3(a) is a bottom view of a structure in which the diamond electron emission cathode shown in FIG. 1 is sandwiched between a pair of current introducing terminals, 3B is a rear surface view thereof.
Figure 4:
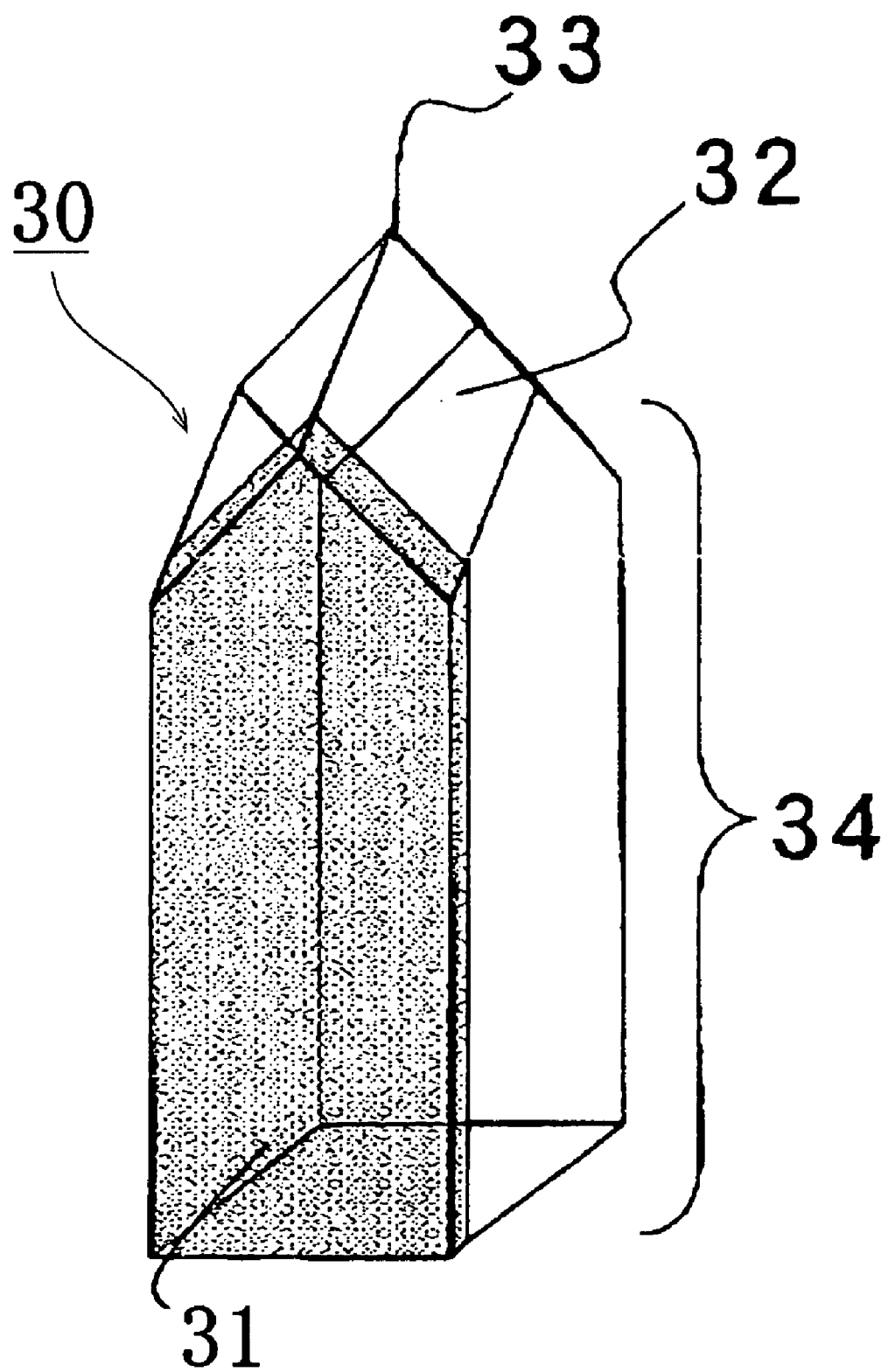
FIG. 4 is a perspective view illustrating another example of the diamond electron emission cathode in accordance with the present invention.
Figure 5:
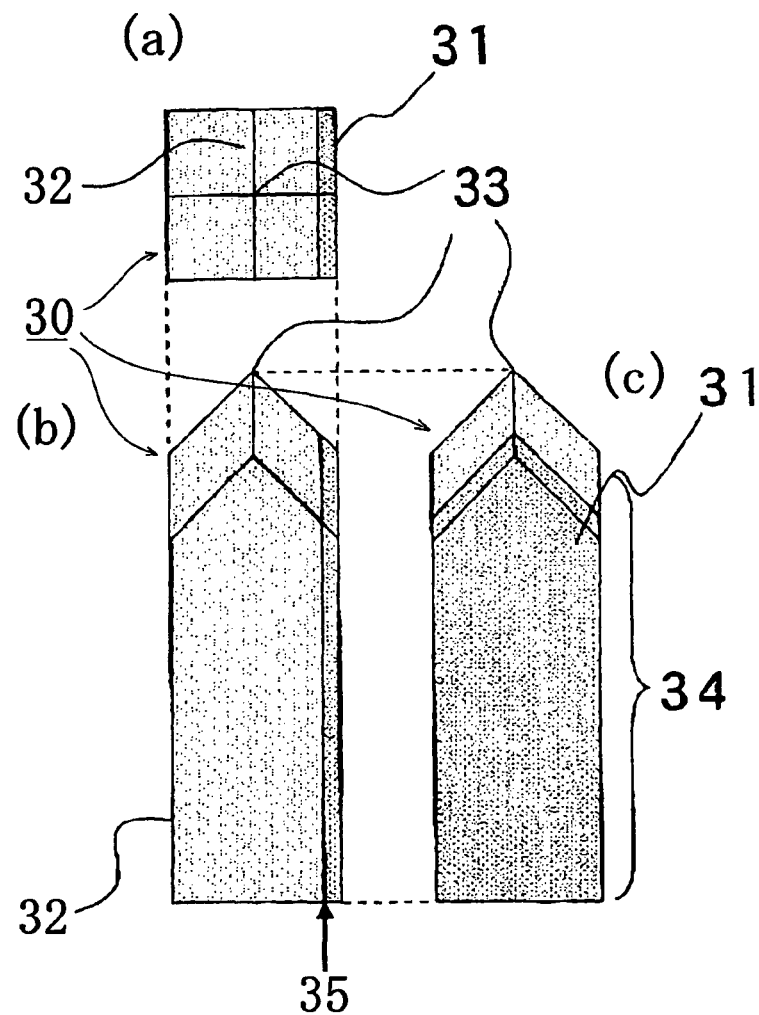
FIG. 5 is a three-plane view of the diamond electron emission cathode shown in FIG. 4.
Figure 6:
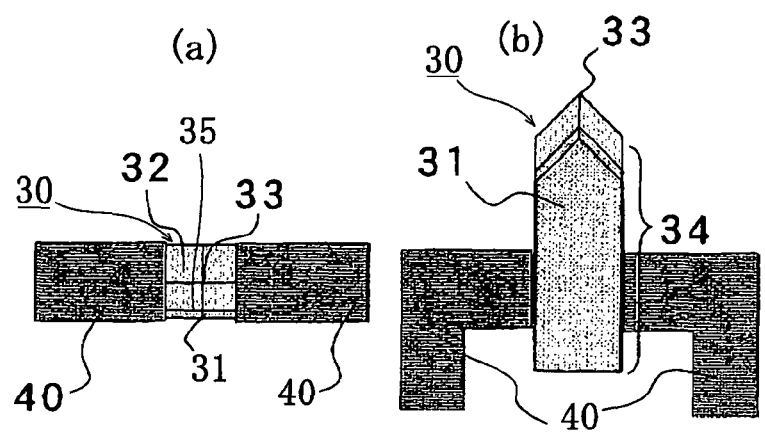
FIG. 6(a) is a bottom view of a structure in which the diamond electron emission cathode shown in FIG. 4 is sandwiched between a pair of current introducing terminals, (b) is a rear surface view thereof.
Figure 7:
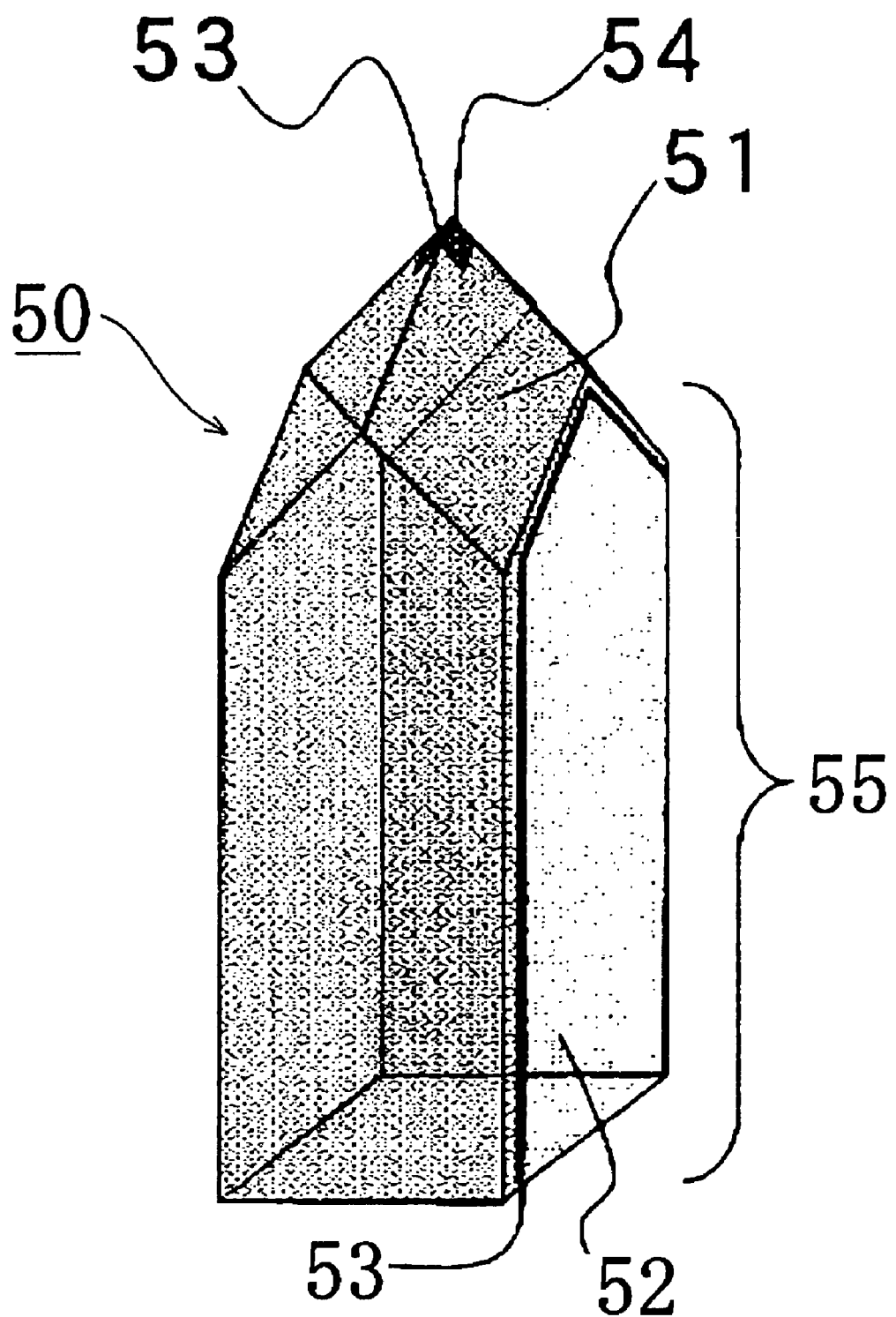
FIG. 7 is a perspective view illustrating yet another example of the diamond electron emission cathode in accordance with the present invention.
Figure 8:
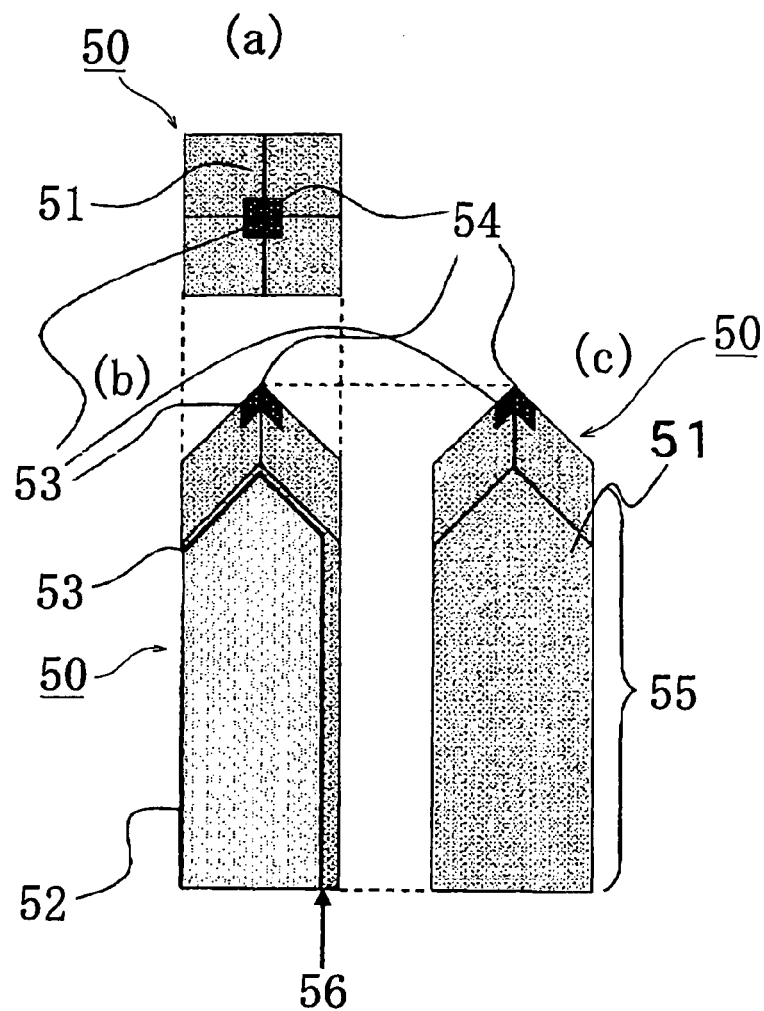
FIG. 8 is a three-plane view of the diamond electron emission cathode shown in FIG. 7.
Figure 9:
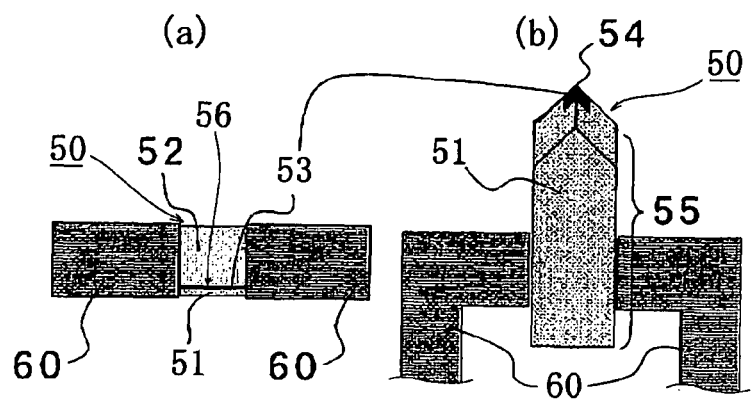
FIG. 9(a) is a bottom view of a structure in which the diamond electron emission cathode shown in FIG. 7 is sandwiched between a pair of current introducing electrodes, (b) is a rear surface view thereof.
Figure 11:
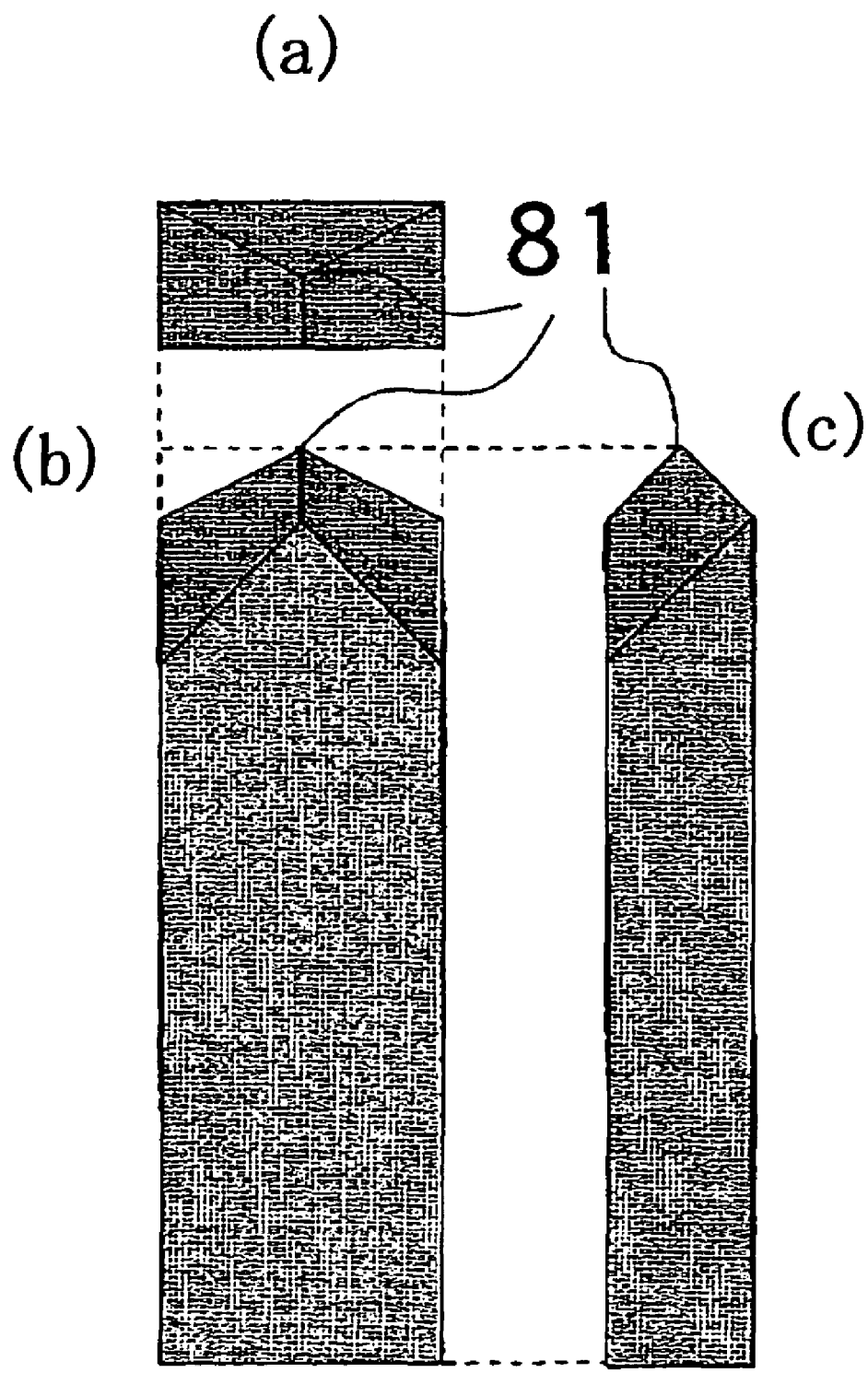
FIG. 11 is a three-plane view illustrating another example of the shape of the electron emitting portion.
Figure 12:
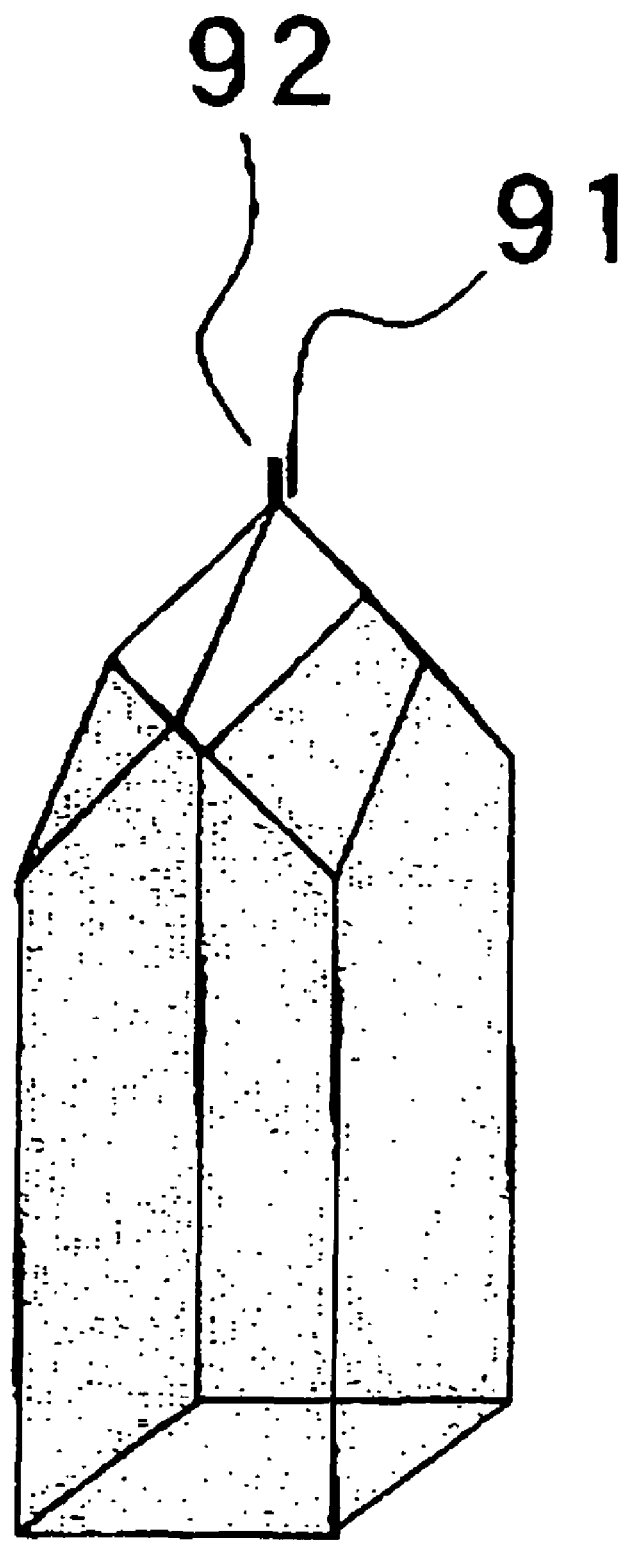
FIG. 12 is a perspective view illustrating yet another example of the diamond electron emission cathode in accordance with the present invention.
Figure 13:
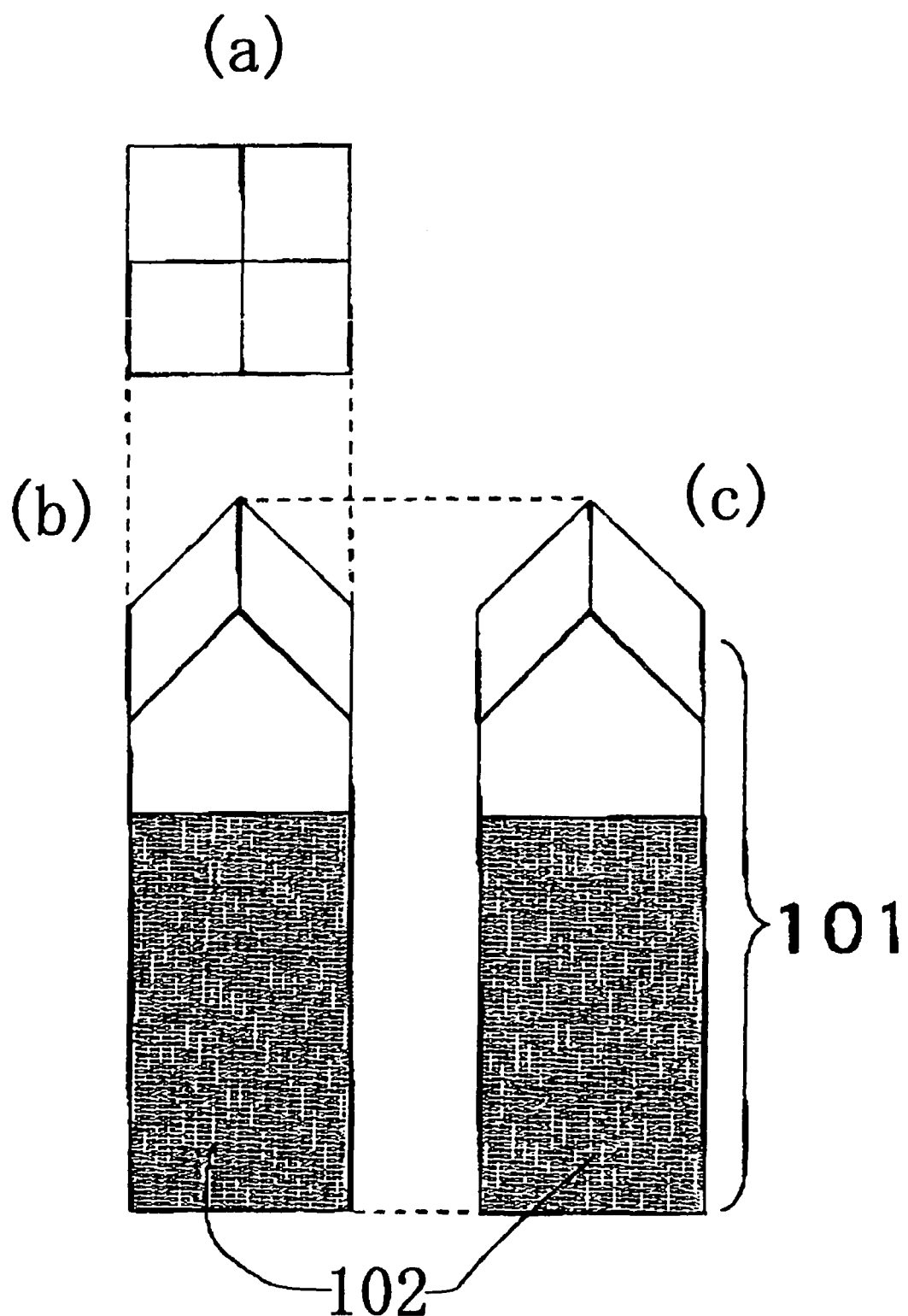
FIG. 13 is a three-plane view illustrating yet another example of the diamond electron emission cathode in accordance with the present invention.
Figure 14:
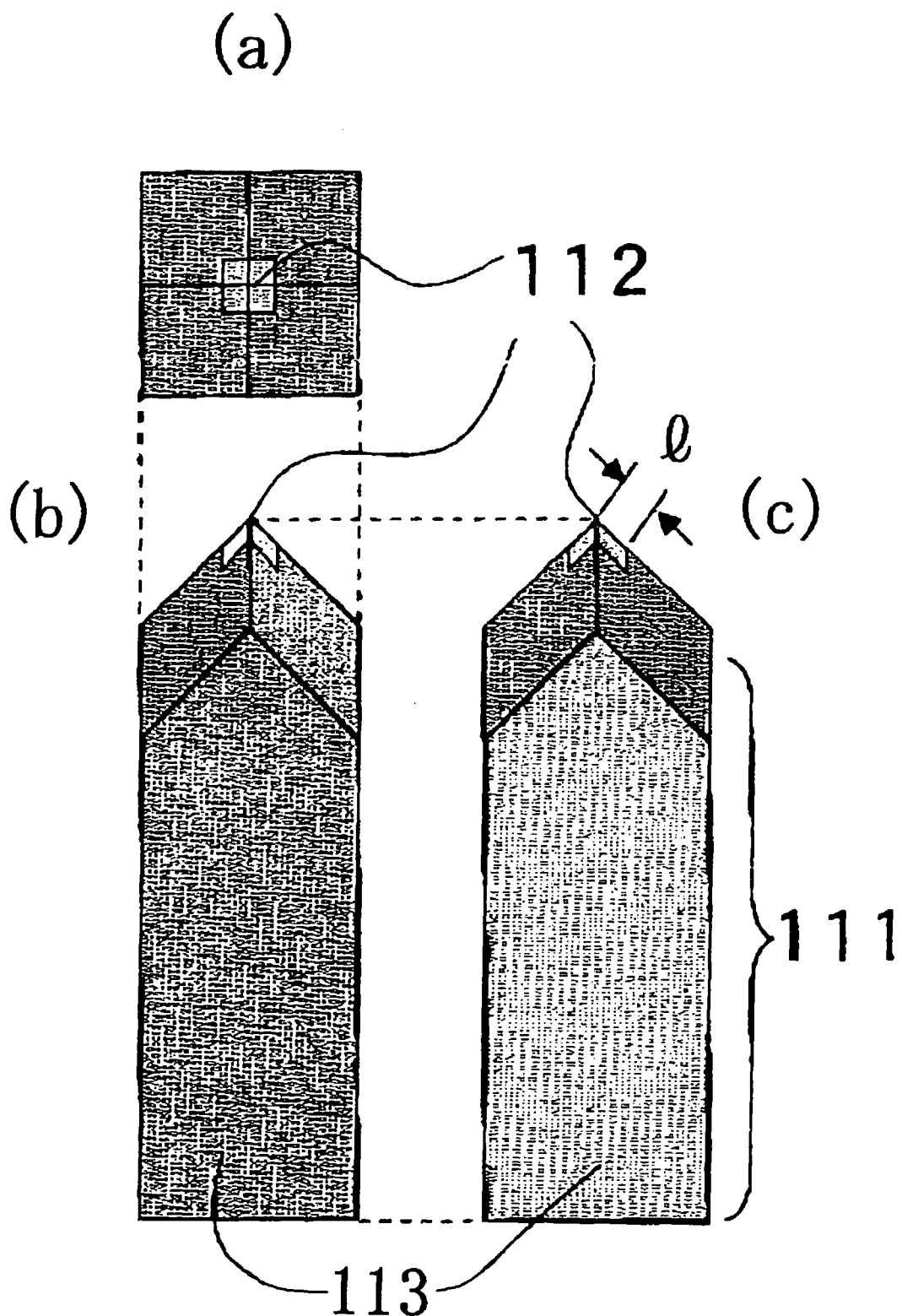
FIG. 14 is a three-plane view illustrating yet another example of the diamond electron emission cathode in accordance with the present invention.
Figure 15:
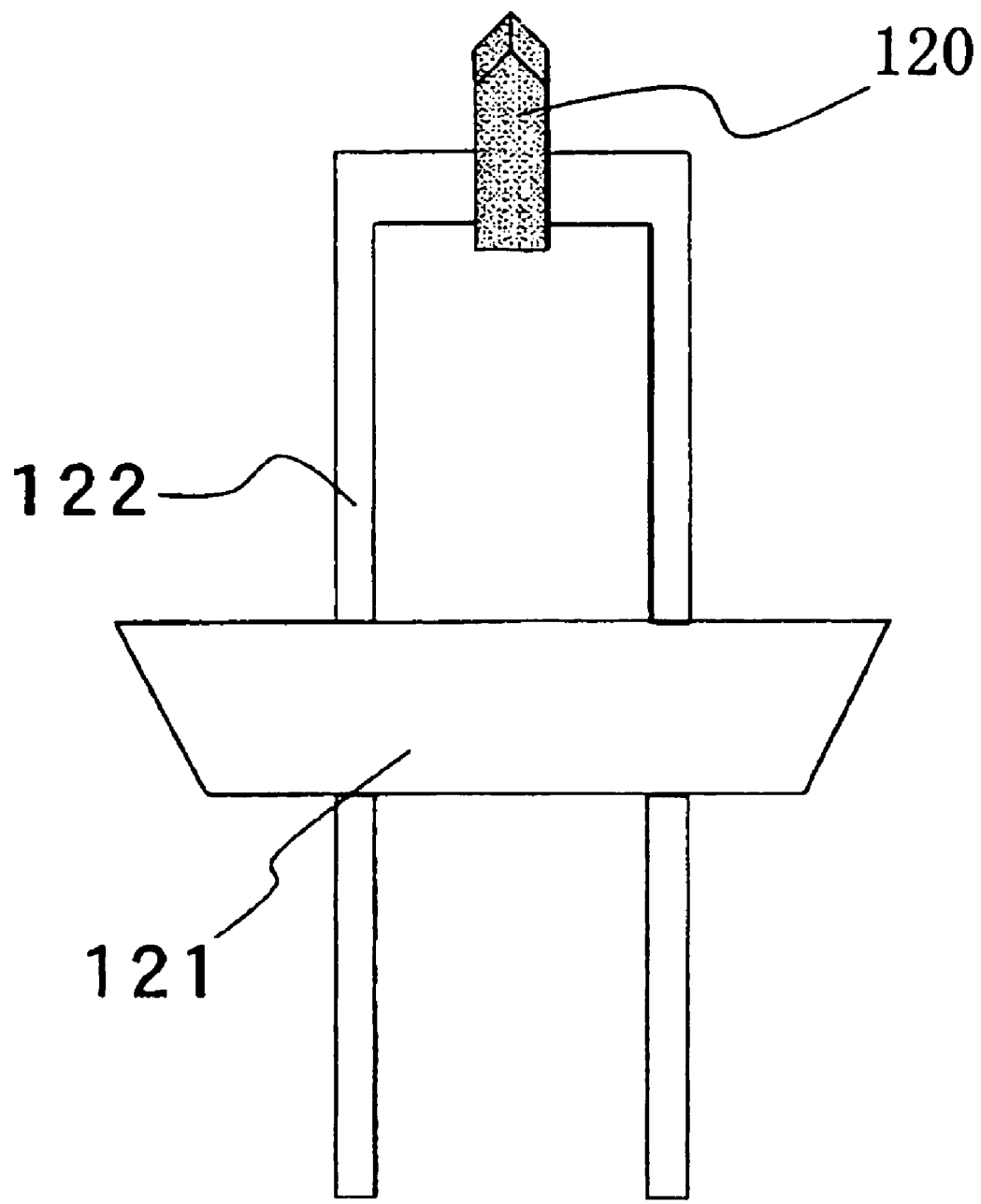
FIG. 15 is a cross-sectional view illustrating an example of the diamond electron emission source in accordance with the present invention.
Figure 16:
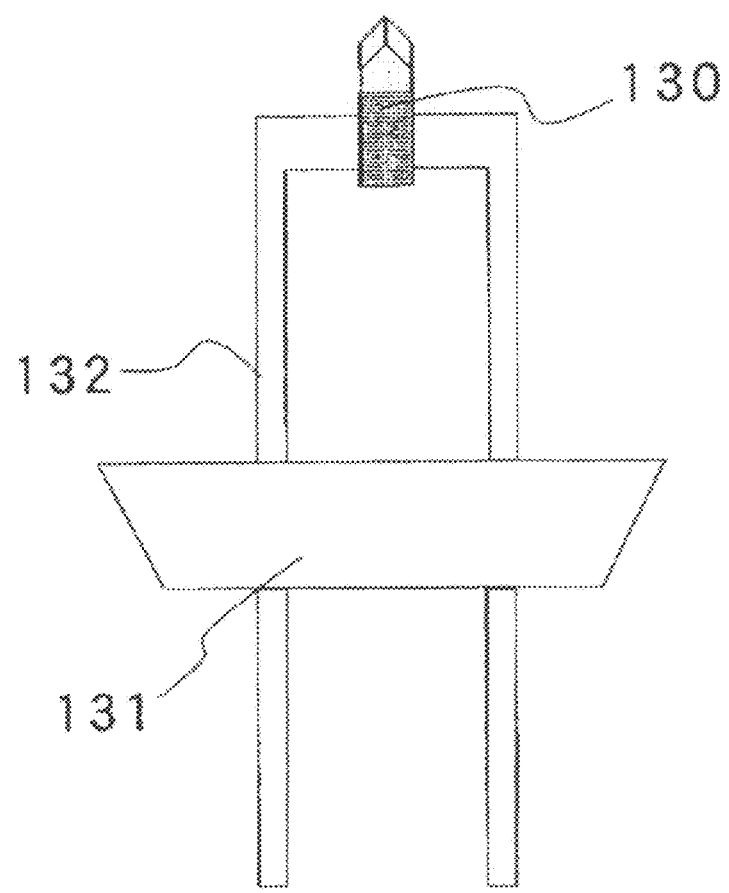
FIG. 16 is a cross-sectional view of another diamond electron emission source in accordance with the present invention.
Figure 17:
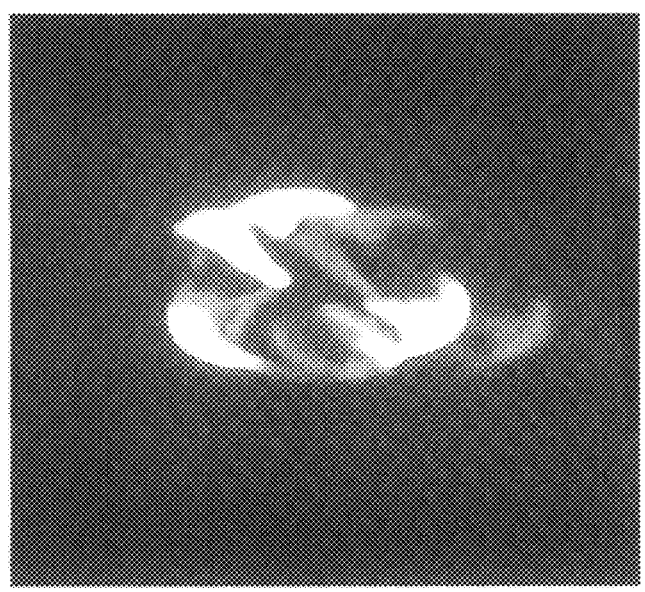
FIG. 17 shows a photo illustrating an example of a pattern of emitted electrons.
Figure 18:
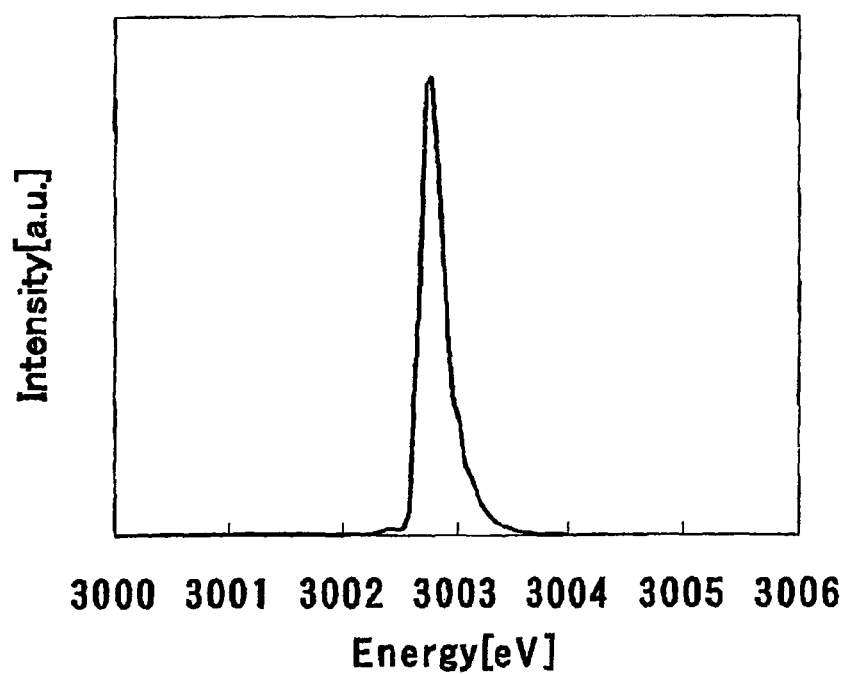
FIG. 18 is a graph shows the results obtained in energy analysis of an electron beam emitted from the diamond electron emission cathode.

10, 30, 50, 120, 130: diamond electron emission cathode
11, 31, 51: n-type semiconductor
12, 32, 52: p-type semiconductor diamond
13, 33, 54, 112: electron emitting portion
14, 34, 55, 101, 111: heating section
15, 35, 56: junction surface
20, 40, 60: current introducing terminal
53: intrinsic semiconductor diamond
71, 81, 91: sharpened acute section
92: protruding structure
102: metal layer
113: metal coating
121, 131: insulating ceramic
122, 132: a pair of support terminals

The invention claimed is:

1. A diamond electron emission cathode having single crystal diamond in at least part thereof, wherein:
said diamond electron emission cathode has a columnar shape formed by a sharpened acute section and a heating section, is provided with one electron emitting portion in said sharpened acute section, and is constituted by at least two types of semiconductors that differ in electric properties, one of the at least two types of the semiconductors is an n-type semiconductor comprising n-type impurities at $2\times10^{15}$ cm$^{-3}$ or higher, another of the at least two types is a p-type semiconductor comprising p-type impurities at $2\times10^{15}$ cm$^{-3}$ or higher, the p-type semiconductor and the n-type semiconductor are joined together, the heating section is energized parallel to a junction surface of the p-type semiconductor and the n-type semiconductor and directly heated by a pair of current introducing terminals, and some of introduced electrons are emitted from said electron emitting portion.

2. The diamond electron emission cathode according to claim 1, wherein said electron emitting portion is formed by said n-type semiconductor.

3. The diamond electron emission cathode according to claim 1, wherein said electron emitting portion is formed by said p-type semiconductor.

4. The diamond electron emission cathode according to claim 1, wherein said n-type semiconductor and said p-type semiconductor are joined via an intrinsic semiconductor with a carrier concentration of $1\times10^9$ cm$^{-3}$ or less and some of the introduced electrons are emitted from said electron emitting portion formed by said intrinsic semiconductor.

5. The diamond electron emission cathode according to claim 4, wherein said p-type semiconductor comprises a single crystal synthesized by vapor phase growth, and said n-type semiconductor and said intrinsic semiconductor are formed by a thin-film crystal synthesized by vapor phase growth.

6. The diamond electron emission cathode according to claim 1, wherein said p-type semiconductor comprises a single crystal synthesized by vapor phase growth, and said n-type semiconductor is formed by a thin-film crystal synthesized by vapor phase growth.

7. The diamond electron emission cathode according to claim 1, wherein the length in the short side direction of said diamond electron emission cathode is 0.05 mm or more to 2 mm or less, and the aspect ratio is 1 or more.

8. The diamond electron emission cathode according to claim 1, wherein at least one plane of planes which constitute the electron emitting portion as an apex in said sharpened acute section, is formed by a (111) crystal plane including off-planes within ±7° from the (111) just plane.

9. The diamond electron emission cathode according to claim 1, wherein a surface of the diamond constituting said electron emitting portion is terminated with hydrogen atoms.

10. The diamond electron emission cathode according to claim 1, wherein a specific resistance of said n-type semiconductor at 300 K is 300 Ωcm or less.

11. The diamond electron emission cathode according to claim 1, wherein a tip end radius or a tip end curvature radius of said sharpened acute section is 30 μm or less.

12. The diamond electron emission cathode according to claim 1, wherein said electron emitting portion has a protruding structure, the tip end diameter of the protruding structure is 5 μm or less, and the aspect ratio is 2 or more.

13. The diamond electron emission cathode according to claim 1, wherein a temperature during electron emission from said electron emitting portion is 400 K or more to 1200 K or less.

14. The diamond electron emission cathode according to claim 1, wherein an electron beam with an energy width of 0.6 eV or less is emitted from said electron emitting portion.

15. The diamond electron emission cathode according to claim 1, wherein said heating section has a metal layer.

16. A diamond electron emission source having a structure comprising the diamond electron emission cathode according to claim 15, an insulating ceramic, and a pair of terminals for supplying an electric current to said diamond electron emission cathode, wherein a resistance value between the terminals is 10Ω or more to 700Ω or less.

17. The diamond electron emission source according to claim 16, wherein said pair of terminals have a melting point of 1700 K or less.

18. An electron microscope equipped with the diamond electron emission source according to claim 16.

19. An electron beam exposure device equipped with the diamond electron emission source according to claim 16.

20. The diamond electron emission cathode according to claim 1, wherein a surface of said diamond electron emission cathode is coated with a metal layer, and the shortest distance from said electron emitting portion to an end portion of the metal layer is 500 μm or less.

21. A diamond electron emission source having a structure comprising the diamond electron emission cathode according to claim 1, an insulating ceramic, and a pair of terminals for supplying an electric current to said diamond electron emission cathode, wherein a resistance value between the terminals is 10Ω or more to 3 kΩ or less.

22. The diamond electron emission source according to claim 21, wherein said pair of terminals have a melting point of 1700 K or less.

23. An electron microscope equipped with the diamond electron emission source according to claim 21.

24. An electron beam exposure device equipped with the diamond electron emission source according to claim 21.

25. A diamond electron emission source having a structure comprising the diamond electron emission cathode according to claim 1, an insulating ceramic, and a pair of support terminals that clamp said diamond electron emission cathode, fix the cathode to said insulating ceramic, and supply an electric current to said diamond electron emission cathode, wherein said support terminals are in direct contact with said diamond electron emission cathode.

26. The diamond electron emission source according to claim 25, wherein said pair of support terminals have a melting point of 1700 K or less.

27. An electron microscope equipped with the diamond electron emission source according to claim 25.

28. An electron beam exposure device equipped with the diamond electron emission source according to claim 25.

29. An electron microscope equipped with the diamond electron emission cathode according to claim 1.

30. An electron beam exposure device equipped with the diamond electron emission cathode according to claim 1.

* * * * *